(12) United States Patent
Wakana et al.

(10) Patent No.: US 8,032,196 B2
(45) Date of Patent: Oct. 4, 2011

(54) JOSEPHSON DEVICE, METHOD OF FORMING JOSEPHSON DEVICE AND SUPERCONDUCTOR CIRCUIT

(75) Inventors: Hironori Wakana, Ohira-machi (JP); Seiji Adachi, Narashino (JP); Koji Tsubone, Higashihiroshima (JP); Keiichi Tanabe, Mito (JP)

(73) Assignees: Chugoku Electric Power Co., Inc., Hiroshima (JP); International Superconductivity Technology Center, The Juridical Foundation, Tokyo (JP)

( * ) Notice: Subject to any disclaimer, the term of this patent is extended or adjusted under 35 U.S.C. 154(b) by 880 days.

(21) Appl. No.: 11/895,256

(22) Filed: Aug. 23, 2007

(65) Prior Publication Data

US 2008/0051292 A1 Feb. 28, 2008

(30) Foreign Application Priority Data

Aug. 23, 2006 (JP) ................................. 2006-226938

(51) Int. Cl.
*H01L 29/06* (2006.01)
*H01L 27/00* (2006.01)
*H01L 29/00* (2006.01)
*H01L 39/22* (2006.01)

(52) U.S. Cl. ........ 505/190; 505/234; 505/329; 505/702; 257/32; 257/33; 257/35

(58) Field of Classification Search ................. 505/190, 505/238, 329, 702, 703, 234, 235; 257/31–36, 257/661–663, E39.003; 365/160–162; 427/62; 204/192.24; 438/2

See application file for complete search history.

(56) References Cited

U.S. PATENT DOCUMENTS

2005/0231196 A1 * 10/2005 Tarutani et al. ............... 324/248

OTHER PUBLICATIONS

Adachi et al, "Structure and Formation mechanism of Interface-Modified Layer in Ramp-Edge Josephson Devices with La-doped 123-Type superconducting electrodes," IEEE Trans. on App. Superconductivity, 2003, V 13(6), 877-880.*

(Continued)

*Primary Examiner* — Stanley Silverman
*Assistant Examiner* — Kallambella Vijayakumar
(74) *Attorney, Agent, or Firm* — Ladas & Parry LLP

(57) ABSTRACT

A Josephson device includes a first superconducting electrode layer, a barrier layer and a second superconducting electrode layer that are successively stacked. The first and second superconducting electrode layers are made of an oxide superconductor material having $(RE)_1(AE)_2Cu_3O_y$ as a main component, where an element RE is at least one element selected from a group consisting of Y, La, Pr, Nd, Sm, Eu, Gd, Dy, Ho, Er, Tm, Yb and Lu, and an element AE is at least one element selected from a group consisting of Ba, Sr and Ca. The barrier layer is made of a material that includes the element RE, the element AE, Cu and oxygen, where in cations within the material forming the barrier layer, a Cu content is in a range of 35 At. % to 55 At. % and an RE content is in a range of 12 At. % to 30 At. %, and the barrier layer has a composition different from compositions of the first and second superconducting electrode layers.

6 Claims, 10 Drawing Sheets

OTHER PUBLICATIONS

Satoh, T., et al. "High Temperature Superconducting Edge-Type Josephson Junctions with Modified Interfaces" *IEEE Transactions on Applied Superconductivity* (1999) vol. 9, No. 2, pp. 3141-3144.

Soutome Y., et al. "HTS Surface-Modified Junctions with Integrated Ground-Planes for SFQ Circuits" *IEICE Trans. Electron* (2002) vol. E85-C, No. 3, pp. 759-763.

Wen, J. G., et al. "Atomic Structure and composition of the barrier in the modified interface high-$T_c$ Josephson junctions studied by transmission electron microscopy" *Applied Physics Letters* (1999) vol. 75, No. 16, pp. 2470-2472.

Adachi, S., et al. "Structure and Formation Mechanism of Interface-Modified Layer in Ramp-Edge Josephson Junctions with La-Doped 123-Type Superconducting Electrodes" *IEEE Transactions on Applied Superconductivity* (2003) vol. 13, No. 2, pp. 877-880.

\* cited by examiner

JOSEPHSON DEVICE, METHOD OF FORMING JOSEPHSON DEVICE AND SUPERCONDUCTOR CIRCUIT

BACKGROUND OF THE INVENTION

1. Field of the Invention

The present invention generally relates to Josephson devices, methods of forming Josephson devices and superconductor circuits, and more particularly to a Josephson device that uses an oxide superconductor, a method of forming such a Josephson device, and a superconductor circuit having such a Josephson device.

2. Description of the Related Art

Ever since the $YBa_2Cu_3O_y$ (YBCO) copper oxide superconductor having a critical temperature of 92 K was found in 1987, active research has been made on oxide superconductors. The Josephson device using the oxide superconductor can obtain a high IcRn product and a junction that has a high superconductive transition temperature. The IcRn product is a product of a maximum superconducting current value (critical current value) Ic that can flow through the superconducting junction at a certain temperature, and a resistance value Rn that is obtained when the superconducting state breaks down and the superconducting junction assumes the normal conducting (or non-superconducting) state. This IcRn product is an index that qualitatively represents the magnitude of the signal and the magnitude of the sensitivity at the time of the switching. By use of such a Josephson device, it is possible to realize a superconductor circuit having a high-speed operation and a sensor having a high sensitivity at temperatures of 40 K or higher.

The technique for forming or fabricating the Josephson device utilizing the Josephson effect is essential in forming devices using the oxide superconductor. Various structures, such as the bi-crystal type, micro-bridge type, step-edge type and ramp-edge type, have been proposed for the Josephson device using the oxide superconductor.

The bi-crystal type junction can be formed with ease by depositing a superconductor film on a substrate which is obtained by bonding surfaces having different crystal orientations, because crystal grains that act as a barrier layer within the superconductor film are formed on the substrate interface. Devices using this bi-crystal type junction, such as the SQUID devices, have already been developed to the stage of merchandising. However, the bi-crystal type junction can only be formed at the bonding interface of the substrate, and is unsuited for application to high-performance devices that require complex structures.

On the other hand, in the case of the stacked-type Josephson device or the ramp-edge type Josephson device shown in FIG. 1A, there are no restrictions on the location where the junction is to be formed, and such devices are advantageous when realizing large-scale integration of the superconductor circuits. The ramp-edge type Josephson device shown in FIG. 1A has a substrate 101, and layers 102, 103 and 104 that are stacked on the substrate 101. The lower electrode layer 102 is made of an oxide superconductor. The insulator layer 103 is interposed between the lower electrode layer 102 and the upper electrode layer 104. A junction 105 is formed via a barrier layer 102a that is formed on a sloping surface of the lower electrode layer 102 between the upper and lower electrode layers 104 and 102. The barrier layer of the stacked-type or ramp-edge type Josephson device is made of a non-superconducting material such as $PrBa_2Cu_3O_y$, $SrTiO_3$, $PrGaO_3$ and $CeO_2$ or, formed by an Interface-Engineered Junction (IEJ). The ramp-edge type Josephson device having the IEJ shown in FIG. 1B has a substrate 101, and layers 102 and 103 that are stacked on the substrate 101. In FIG. 1B, those parts that are the same as those corresponding parts in FIG. 1A are designated by the same reference numerals, and a description thereof will be omitted. The barrier layer 102a is formed to a thickness of several nm on the sloping surface of the lower electrode 102, by bombarding Ar ions on the sloping surface so as to make the barrier layer 102a amorphous and forming the upper electrode layer 103 (not shown in FIG. 1B) so as to cover the barrier layer 102a. For this reason, compared to the Josephson device having the junction made of a conductor material, the Josephson device having the IEJ can suppress inconsistencies in the junction characteristics and realize a relatively high IcRn product.

With respect to the Josephson device having the IEJ function, T. Satoh et al., "High-Temperature Superconducting Edge-Type Josephson Junctions with Modified Interfaces", IEEE Trans. Appl. Supercond. Vol. 9, No. 2, June 1999, pp. 3141-3144 reported experimental results of 10 junctions at a temperature of 4.2 K including an IcRn product of 1.5 mV to 3 mV and a 1σ (σ denotes standard deviation) of the maximum current value Ic of approximately 8%. In addition, Y. Soutome et al., "HTS Surface-Modified Junctions with Integrated Ground-Planes for SFQ Circuits", IEICE Trans. Electron. Vol. E85-C, No. 3, March 2002, pp. 759-763 reported experimental results of 100 junctions at a temperature of 4.2 K including an IcRn product of 1.5 mV and a 1σ (σ denotes standard deviation) of the maximum superconducting current value Ic of approximately 7.9%.

When considering the application of the Josephson junction to the devices, it is desirable from the point of view of reducing the system cost to realize a Josephson device that can operate at a high speed at a high temperature and has a high sensitivity. The IcRn product must be large in order to realize such a Josephson device, but a sufficiently large IcRn product has not be obtained in T. Satoh et al. and Y. Soutome et al. referred above.

SUMMARY OF THE INVENTION

Accordingly, it is a general object of the present invention to provide a novel and useful Josephson device, method of forming Josephson device and superconductor circuit, in which the problems described above are suppressed.

Another and more specific object of the present invention is to provide a Josephson device, a method of forming Josephson device and a superconductor circuit, having an improved IcRn product.

Still another object of the present invention is to provide a Josephson device comprising a first superconducting electrode layer, a barrier layer and a second superconducting electrode layer that are successively stacked, wherein the first and second superconducting electrode layers are made of an oxide superconductor material having $(RE)_1(AE)_2Cu_3O_y$ as a main component, where an element RE is at least one element selected from a group consisting of Y, La, Pr, Nd, Sm, Eu, Gd, Dy, Ho, Er, Tm, Yb and Lu, and an element AE is at least one element selected from a group consisting of Ba, Sr and Ca, and the barrier layer is made of a material that includes the element RE, the element AE, Cu and oxygen, where in cations within the material forming the barrier layer, a Cu content is in a range of 35 At. % to 55 At. % and an RE content is in a range of 12 At. % to 30 At. %, and the barrier layer has a composition different from compositions of the first and second superconducting electrode layers. According to the present invention, it is possible to avoid the problem of the Cu content of the barrier layer becoming extremely small, unlike the conventional IEJ, because the barrier layer is a deposited layer of the oxide material, and a satisfactory superconducting junction can be formed. As a result, it is possible to improve the IcRn product of the Josephson device. In addition, it is also possible to suppress inconsistencies in the critical current value Ic. Moreover, the critical temperature of the superconducting junction becomes high compared to that of the conventional IEJ. Consequently, the cooling cost of the Josephson device can be reduced. It is preferable that the compositions of the first and second superconducting electrode layers are detected by an analyzing method similar to that used to detect the composition of the barrier layer, and to compare the compositions at a distance of approximately 10 nm from the interface between the barrier layer and the first and second superconducting electrode layers.

A further object of the present invention is to provide a Josephson device comprising a substrate; a first superconducting electrode layer formed on the substrate and having a first sloping surface portion on one end surface thereof; an insulator layer formed on the first superconducting electrode layer and having a second sloping surface portion on one end surface thereof, so that the first and second sloping surface portions form a continuous sloping surface; a barrier layer deposited on the sloping surface; and a second superconducting electrode layer covering the barrier layer, wherein the first and second superconducting electrode layers are made of an oxide superconductor material having $(RE)_1(AE)_2Cu_3O_y$, as a main component, where an element RE is at least one element selected from a group consisting of Y, La, Pr, Nd, Sm, Eu, Gd, Dy, Ho, Er, Tm, Yb and Lu, and an element AE is at least one element selected from a group consisting of Ba, Sr and Ca; and the barrier layer is made of a material that includes the element RE, the element AE, Cu and oxygen, where in cations within the material forming the barrier layer, a Cu content is in a range of 35 At. % to 55 At. % and an RE content is in a range of 12 At. % to 30 At. %, and the barrier layer has a composition different from compositions of the first and second superconducting electrode layers. According to the present invention, it is possible to realize a ramp-edge type Josephson device that can obtain effects similar to those described above.

Another object of the present invention is to provide a Josephson device comprising a substrate having a surface; a first superconducting electrode layer formed on the surface of the substrate; an insulator formed on the first superconducting electrode layer and having a penetration hole penetrating the insulator layer in a direction taken along a thickness of the insulator layer; a barrier layer deposited on the first superconducting electrode layer and within the penetration hole; and a second superconducting electrode layer filling the penetration hole and covering the barrier layer and the insulator layer, wherein the first and second superconducting electrode layers are made of an oxide superconductor material having $(RE)_1(AE)_2Cu_3O_y$ as a main component, where an element RE is at least one element selected from a group consisting of Y, La, Pr, Nd, Sm, Eu, Gd, Dy, Ho, Er, Tm, Yb and Lu, and an element AE is at least one element selected from a group consisting of Ba, Sr and Ca; and the barrier layer is made of a material that includes the element RE, the element AE, Cu and oxygen, where in cations within the material forming the barrier layer, a Cu content is in a range of 35 At. % to 55 At. % and an RE content is in a range of 12 At. % to 30 At. %, and the barrier layer has a composition different from compositions of the first and second superconducting electrode layers. According to the present invention, it is possible to realize a stacked type Josephson device that can obtain effects similar to those described above.

Still another object of the present invention is to provide a method of forming a Josephson device comprising the steps of (a) forming on a substrate a first superconducting electrode layer made of an oxide superconductor material; (b) forming an insulator layer covering the first superconducting electrode layer; (c) removing a portion of the insulator layer to expose the first superconducting electrode layer; (d) depositing a barrier layer made of an oxide material on an exposed surface of the first superconducting electrode layer; and (e) forming a second superconducting electrode layer made of an oxide superconductor material to cover the barrier layer, wherein the oxide material forming the barrier layer includes an element RE, an element AE, Cu and oxygen, where the element RE is at least one element selected from a group consisting of Y, La, Pr, Nd, Sm, Eu, Gd, Dy, Ho, Er, Tm, Yb and Lu, and the element AE is at least one element selected from a group consisting of Ba, Sr and Ca. According to the present invention, because the barrier layer is a deposited layer, the layer quality of the barrier layer becomes satisfactory compared to that of the barrier layer of the conventional IEJ, and the IcRn product is improved. It is possible to avoid damages within the crystals and to suppress the current leak, even if the Cu content of the barrier layer is high such that the current leak would otherwise be generated between the first and second superconductor electrode layers of the Josephson device using the conventional IEJ.

A further object of the present invention is to provide a superconductor circuit using magnetic flux quantum as signal carrier, comprising at least one Josephson device comprising a first superconducting electrode layer, a barrier layer and a second superconducting electrode layer that are successively stacked, wherein the first and second superconducting electrode layers are made of an oxide superconductor material having $(RE)_1(AE)_2Cu_3O_y$ as a main component, where an element RE is at least one element selected from a group consisting of Y, La, Pr, Nd, Sm, Eu, Gd, Dy, Ho, Er, Tm, Yb and Lu, and an element AE is at least one element selected from a group consisting of Ba, Sr and Ca; and the barrier layer is made of a material that includes the element RE, the element AE, Cu and oxygen, where in cations within the material forming the barrier layer, a Cu content is in a range of 35 At. % to 55 At. % and an RE content is in a range of 12 At. % to 30 At. %, and the barrier layer has a composition different from compositions of the first and second superconducting electrode layers. According to the present invention, it is possible to realize a superconductor circuit having the Josephson device that can obtain effects similar to those described above.

Other objects and further features of the present invention will be apparent from the following detailed description when read in conjunction with the accompanying drawings.

DESCRIPTION OF THE PREFERRED EMBODIMENTS

Figure 1A:
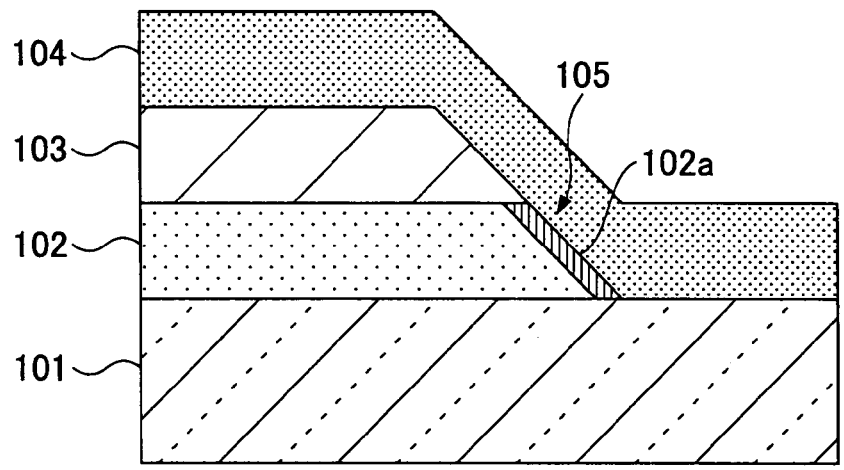
FIGS. 1A and 1B are cross sectional views showing examples of conventional Josephson devices.
Figure 1B:
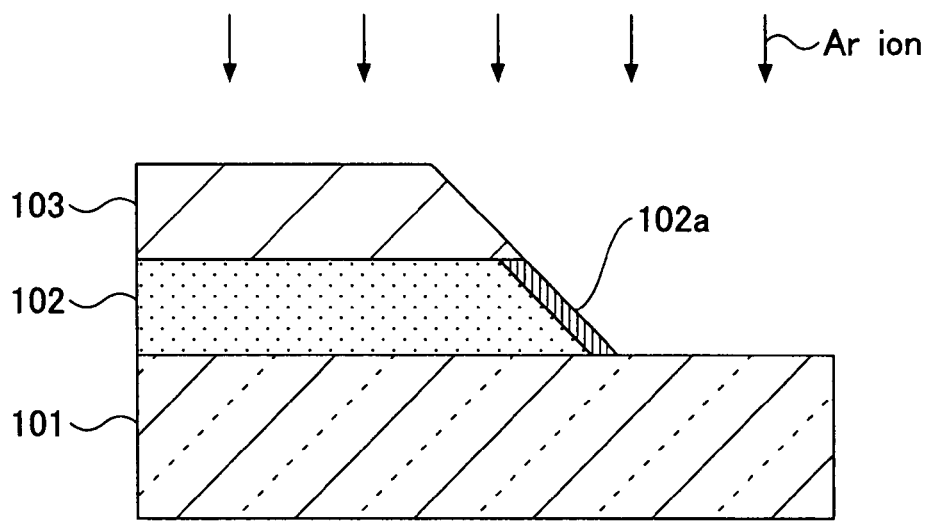

As a result of devoted research, the present inventors have found that it is possible to realize a Josephson device having satisfactory junction characteristics, such as an improved IcRn product, by forming first and second superconducting electrode layers from an oxide superconductor material having $(RE)_1(AE)_2Cu_3O_y$ as the main component, and forming at a superconducting junction between the first and second superconducting electrode layers a barrier layer made from an oxide material having a predetermined composition range. The element RE is at least one element selected from a group consisting of Y, La, Pr, Nd, Sm, Eu, Gd, Dy, Ho, Er, Tm, Yb and Lu, and the element AE is at least one element selected from a group consisting of Ba, Sr and Ca.

The barrier layer of the Josephson device according to the present invention is a deposited layer that includes the element RE, the element AE, Cu and oxygen. In addition, in the cations within the oxide material forming the barrier layer, the Cu content is set in a range of 35 atomic percent (At. %) to 55 At. % and the RE content is set in a range of 12 At. % to 30 At. %, and further, the composition of the barrier layer is different from the compositions of the first and second superconducting electrode layers. By using this barrier layer, the present inventors have found through experimentation that the IcRn product is improved by 30% or more compared to the IcRn product of the conventional Josephson device having the Interface-Engineered Junction (IEJ). It may be regarded that the functions achieved by the present invention are due to the following.

That is, if an oxide superconductor material is used for the Josephson device, the IcRn product is theoretically 10 mV or higher. However, in the Josephson device having the IEJ, the IcRn product that is actually obtained is not as high as 10 mV. For example, in the case of a barrier layer that is made from a $YBa_2Cu_3O_y$ (YBCO) (Y:Ba:Cu=17:33:50) oxide superconductor material and is formed by bombardment of Ar ions, J. G. Wen et al., "Atomic structure and composition of the barrier in the modified interface high-Tc Josephson junction studied by transmission electron microscopy", Appl. Phys. Lett., Vol. 75, No. 16, 18 Oct. 1999, pp. 2470-2472 reported that the composition ratio becomes Y:Ba:Cu=43:30:27, S. Adachi et al., "Structure and Formation Mechanism of Interface-Modified Layer in Ramp-Edge Josephson Junctions With La-Doped 123-Type Superconducting Electrodes", IEEE Trans. Appl. Supercond., Vol. 13, No. 2, June 2003, pp. 877-880 reported that the composition ratio becomes (Y+Yb):(Ba+La):Cu=20:(38+10):32, and both J. G. Wen et al. and S. Adachi et al. reported a considerable decrease in the Cu content. Moreover, both J. G. Wen et al. and S. Adachi et al. reported the IcRn product to be approximately 2 mV which is not sufficiently high.

The barrier layer of the IEJ has a crystal phase having the Perovskite structure. The Perovskite structure is represented by a chemical formula $ABO_3$, and the A ion and the B ion are surrounded by 12 and 6 oxygens, respectively. The cation (positive ion) having the relatively large ion radius occupies the site of the A ion (that is, the A site), and the cation having the relatively small ion radius occupies the site of the B ion (that is, the B site). In the case of the composition ratio Y:Ba:Cu=30:43:27 reported in J. G. Wen et al., the Ba ions occupy the A site and the Cu ions occupy the B site. The Y ions must be distributed approximately evenly to the A site and the B site. But because it is extremely difficult for the Y ions to occupy the B site, there is a possibility that the unstable Y will precipitate in the form of $Y_2O_3$. The precipitation of $Y_2O_3$ has actually been confirmed in a vicinity of the interface for the Josephson device having poor junction characteristics. In addition, in the case of the composition in which there is considerable lack of Cu atoms in the barrier layer, the diffusion of the Cu atoms occurs in the vicinity of the interface of the barrier layer when depositing the second (or upper) superconducting electrode layer, to thereby deteriorate the superconductivity in the vicinity of the junction interface. It may be regarded that the decrease in the superconductive transition temperature of the superconducting junction and the decrease in the IcRn product are caused by the factors described above.

On the other hand, the barrier layer of the Josephson device according to the present invention is a deposited layer that includes the element RE, the element AE, Cu and oxygen, as described above. In addition, in the cations within the oxide material forming the barrier layer, the Cu content is set in a range of 35 At. % to 55 At. % and the RE content is set in a range of 12 At. % to 30 At. %. For this reason, it is possible to avoid excessive Y ions (ions of the element RE) and the extreme lack of Cu ions that were encountered in the case of the barrier layer of the IEJ, and it may be regarded that the IcRn product of the Josephson device according to the present invention is increased thereby.

Embodiments of the present invention will now be described with reference to FIG. 2 and the subsequent drawings.

First Embodiment

Figure 2:
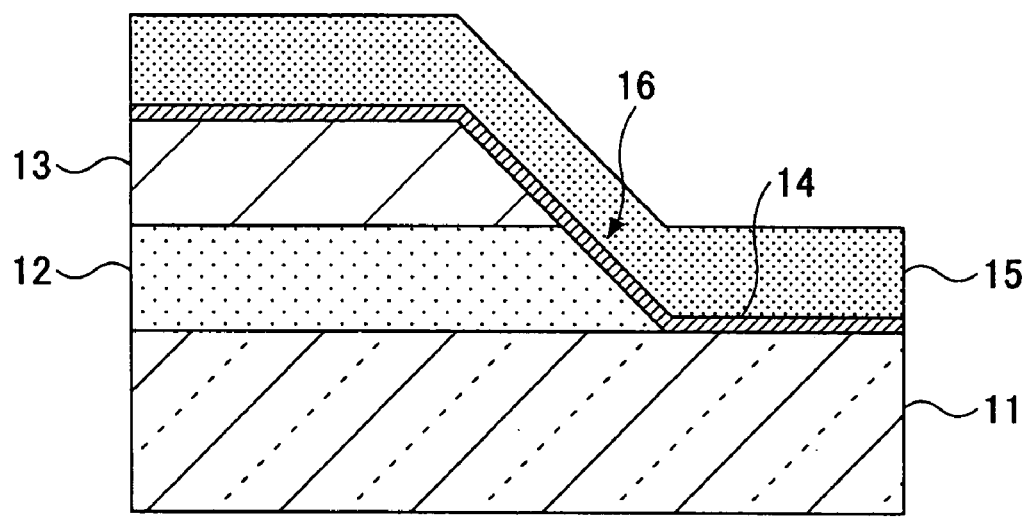
FIG. 2 is a cross sectional view showing a Josephson device in a first embodiment of the present invention.

FIG. 2 is a cross sectional view showing a Josephson device in a first embodiment of the present invention.

A Josephson device 10 of the first embodiment shown in FIG. 2 has the ramp-edge structure. The Josephson device 10 has a substrate 11, a lower electrode layer 12 formed on the substrate 11, an insulator layer 13 covering the lower electrode layer 12, a barrier layer 14, and an upper electrode layer 15 covering the barrier layer 14. The barrier layer 14 covers a surface of the substrate 11, a sloping surface formed at one end of each of the lower electrode layer 12 and the insulator layer 13, and a surface of the insulator layer 13. A superconducting junction 16 is formed by the lower electrode layer 12, the barrier layer 14 and the upper electrode layer 15.

The substrate 11 is made of a material having a crystal structure that allows epitaxial growth of the lower electrode layer 12 on the substrate 11. For example, the substrate 11 may be made of a material selected from a group consisting of MgO, yttrium stabilized zirconia (YSZ), $SrTiO_3$, $(LaAlO_3)_{0.3}$-$(SrAl_{0.5}Ta_{0.5}O_3)_{0.7}$ (LSAT), $LaAlO_3$ and SrTiO3.

A buffer layer (not shown) may be provided on the substrate 11. When providing this buffer layer, the buffer layer is made of a material having a crystal structure that allows epitaxial growth of the lower electrode layer 12 on the buffer layer. For example, this buffer layer may be made of a material selected from a group consisting of $SrTiO_3$, $CeO_2$ and $BaZrO_3$.

The lower electrode layer 12 and the upper electrode layer 15 are made of an oxide superconductor material having $(RE)_1(AE)_2Cu_3O_y$ as the main component. The element RE is at least one element selected from a group consisting of Y, La, Pr, Nd, Sm, Eu, Gd, Dy, Ho, Er, Tm, Yb and Lu, and the element AE is at least one element selected from a group consisting of Ba, Sr and Ca. The main component $(RE)_1(AE)_2Cu_3O_y$ has the Perovskite structure as its basic structure. $(RE)_1(AE)_2Cu_3O_y$ indicates that the molar ratio of the element RE, the element AE, Cu and O is 1:2:3:y. The main component $(RE)_1(AE)_2Cu_3O_y$ means that, although the molar ratio 1:2:3:y is most preferable, a slight deviation in the compositions may occur due to the controllability of the planar surfaces of the upper and lower electrode layers 15 and 12, the improvement in the superconducting critical current value and the like.

For example, suitable superconductor materials that may be used for the upper and lower electrodes 15 and 12 are YBaCuO-based alloys such as $YBa_2Cu_3O_y$ (YBCO), $SmBa_2Cu_3O_y$ (SBCO) and $YbBa_2Cu_3O_y$ (YbBCO).

The insulator layer 13 is made of an insulator material having the Perovskite structure as its basic structure that allows epitaxial growth of the insulator layer 13 on the lower electrode layer 12 and also allows epitaxial growth of the upper electrode layer 15 on the insulator layer 13. For example, the insulator layer 13 is preferably made of a material selected from a group consisting of $SrSnO_3$, $SrTiO_3$ and $PrGaO_3$.

The barrier layer 14 is a deposited layer that includes the element RE, the element AE, Cu and oxygen. In the barrier layer 14, the element RE is at least one element selected from a group consisting of Y, La, Pr, Nd, Sm, Eu, Gd % Dy, Ho, Er, Tm, Yb and Lu, and the element AE is at least one element selected from a group consisting of Ba, Sr and Ca. In addition, in the cations within the oxide material forming the barrier layer 14, the Cu content is set in a range of 35 At. % to 55 At. % and the RE content is set in a range of 12 At. % to 30 At. %, and further, the composition of the barrier layer 14 is different from the compositions of the upper and lower electrode layers 15 and 12. Because the barrier layer 14 has this composition and is a deposited layer, a satisfactory superconducting junction 16 is formed, and it is possible to improve the IcRn product of the Josephson device 10.

Figure 3:
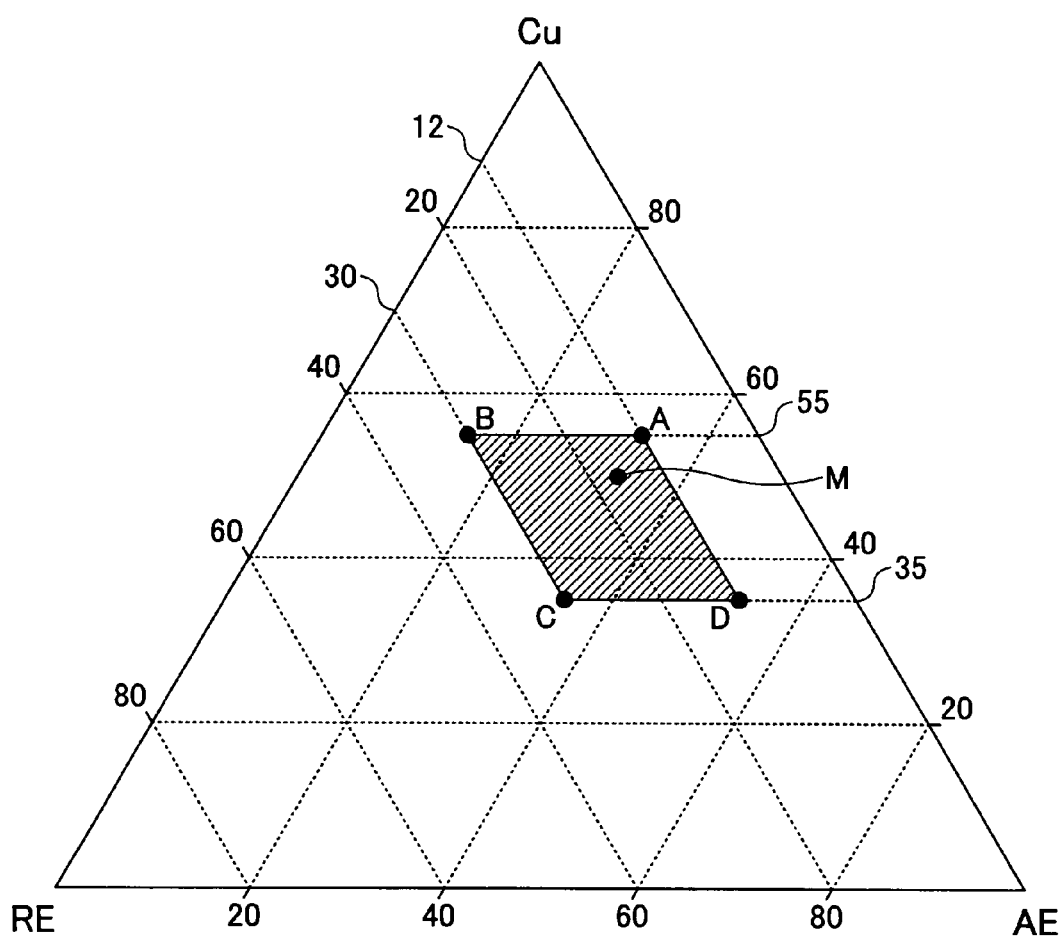
FIG. 3 is a diagram showing a composition range of a barrier layer.

FIG. 3 is a diagram showing a composition range of the barrier layer 14, and shows the 3-element composition of only the cations of RE, AE and Cu. In FIG. 3, when a normal to one side is drawn from a point indicating the composition, the length of this normal becomes proportional to the content of the element at the vertex confronting this one side. For example, the composition at a point A in FIG. 3 includes an RE content of 12 At. %, an AE content of 33 At. % and a Cu content of 55 At. %. The scale in FIG. 3 indicates the At. %.

In the cations within the oxide material forming the barrier layer 14 shown in FIG. 2, the Cu content is set in a range of 35 At. % to 55 At. % and the RE content is set in a range of 12 At. % to 30 At. % as shown in FIG. 3. This composition range of the oxide material forming the barrier layer 14 falls within a hatched region in FIG. 3 that is surrounded by connecting the points A, B, C and D by straight lines in this order. In FIG. 3, a point M indicates the composition of the cation of the superconductor material $(RE)_1(AE)_2Cu_3O_y$ that is the main component of the superconductor material forming the upper and lower electrode layers 15 and 12.

If the Cu content of the oxide material forming the barrier layer 14 becomes less than 35 At. %, the IcRn product of the Josephson device 10 decreases. On the other hand, if the Cu content of the oxide material forming the barrier layer 14 exceeds 55 At. %, the Josephson device 10 displays a Flux Flow (FF) type current versus voltage characteristic that is not preferable. A description on the FF type current versus voltage characteristic will be given later in the specification.

In addition, if the RE content of the oxide material-forming the barrier layer 14 becomes less than 12 At. %, the lack of the element RE occurs to thereby make it difficult to maintain the Perovskite structure, and a transition is made to another phase in which the junction displays a resistor type characteristic. On the other hand, if the RE content of the oxide material forming the barrier layer 14 exceeds 30 At. %, the excessive RE atoms precipitates in the form of $RE_2O_3$ or the like to thereby deteriorate the junction characteristics, and causes a decrease in the IcRn product, for example.

Furthermore, the composition of the barrier layer 14 is made different from the compositions of the upper and lower electrode layers 15 and 12, so that the junction interface is formed and the barrier layer 14 functions as a barrier. Preferably, the Cu content and the RE content of the barrier layer 14 respectively differ from those of the upper and lower electrode layers 15 and 12 by 3 At. % or more, so that the formation of a stable barrier layer 14 becomes possible.

Preferably, the thickness of the barrier layer 14 is set in a range of 0.5 nm to 6 nm. If the thickness of the barrier layer 14 becomes less than 0.5 nm, the Josephson device 10 may begin to display the FF type current versus voltage characteristic. On the other hand, if the thickness of the barrier layer 14 exceeds 6 nm, the IcRn product may decrease to 2 mV or less, for example. Since the barrier layer 14 is extremely thin, the composition analysis of the barrier layer 14 is made by an Energy Dispersive X-ray spectroscopy (EDX) by irradiating an electron beam from a transmission electron microscope on the barrier layer 14 by setting the electron beam diameter to 1 nm or less, as will be described later in the specification.

Therefore, because the Josephson device 10 in the first embodiment has the barrier layer 14 that is formed by the deposited layer made of the oxide material, it is possible to form a satisfactory superconducting junction 16 by avoiding the problem of the conventional IEJ, namely, the problem in that the Cu content of the barrier layer becomes extremely small in the conventional IEJ. As a result, it is possible to improve the IcRn product of the Josephson device 10. In addition, it is possible to suppress the inconsistency in the critical current value Ic of the Josephson device 10. Moreover, the critical temperature of the superconducting junction 16 of the Josephson device 10 becomes higher than that of the conventional IEJ. As a result, it is possible to reduce the cooling cost of the Josephson device 10.

Next, a description will be given of a method of forming the Josephson device in the first embodiment.

FIGS. 4A through 4E are cross sectional views for explaining the processes (or steps) of forming the Josephson device in the first embodiment.

Figure 4A:
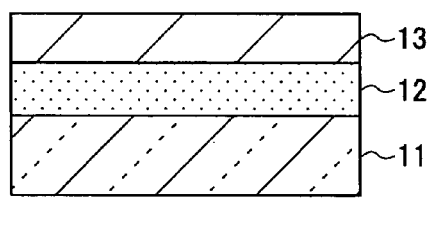
FIGS. 4A through 4E are cross sectional views for explaining the processes of forming the Josephson device in the first embodiment.

First, in the process shown in FIG. 4A, the lower electrode layer 12 and the insulator layer 13 are successively formed on the substrate 11 using the materials described above. The lower electrode layer 12 and the insulator layer 13 may be formed by vacuum deposition, sputtering, Pulsed Laser Deposition (PLD) or, Chemical Vapor Deposition (CVD). Such methods of forming the lower electrode layer 12 and the insulator layer 13 may also be used when forming the upper electrode layer 15 and a buffer layer 31 of a Josephson device 30 shown in FIG. 12 which will be described later. The substrate temperature differs depending on the materials that are used, but may be set in a range of 300° C. to 800° C., for example.

Figure 4D:
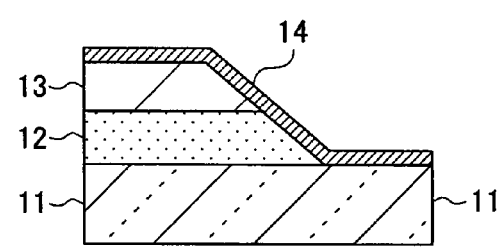
Figure 4B:
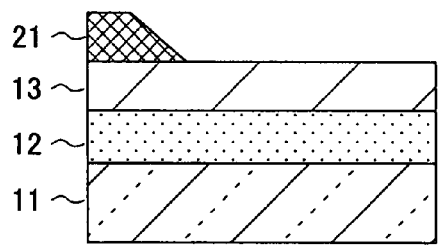

Next, in the process shown in FIG. 4B, a resist layer 21 is formed on the insulator layer 13, and the resist layer 21 is patterned to form an opening at the position where the ramp-edge is to be formed. Then, a reflow process is carried out with respect to the resist layer 21, and a sloping surface is formed by a side edge surface of the resist layer 21.

Figure 4E:
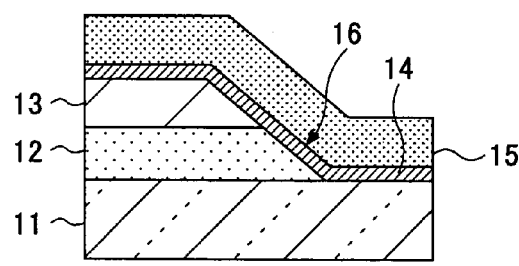
Figure 4C:
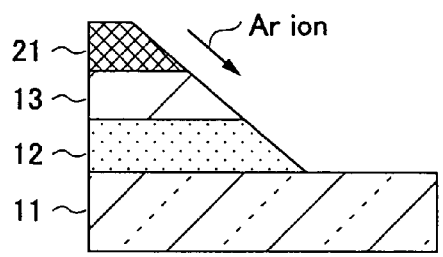

Thereafter, in the process shown in FIG. 4C, the resist layer 21 is used as a mask, and an etching process is carried out with respect to the insulator layer 13 and the lower electrode layer 12 by Ar ion irradiation. The Ar ion irradiation is made by rotating the substrate 11, while maintaining an incident direction of the Ar ion irradiation to be inclined by 30°, for example, with respect to the surface of the substrate 11 (that is, the substrate surface). As a result, a sloping surface is formed by the side edge surfaces of the resist layer 21, the insulator layer 13 and the lower electrode layer 12, and the resist layer 21 is thereafter removed.

Next, in the process shown in FIG. 4D, the barrier layer 14 is formed on the sloping surface portion of the lower electrode layer 12, the (top) surface and the sloping surface portion of the insulator layer 13, and the exposed surface of the substrate 11. The barrier layer 14 may be deposited by vacuum deposition, sputtering, PLD or, CVD including Metal Organic CVD (MOCVD), using an oxide material.

When using the vacuum deposition, sputtering or PLD in the deposition process of the barrier layer 14, the oxide material used for the evaporation source or the target includes the element RE, the element AE, Cu and oxygen, where the element RE is at least one element selected from a group consisting of Y, La, Pr, Nd, Sm, Eu, Gd, Dy, Ho, Er, Tm, Yb and Lu, and the element AE is at least one element selected from a group consisting of Ba, Sr and Ca. An example of such an oxide target material is $(RE)_1(AE)_2Cu_3O_y$, including $YBa_2Cu_3O_y$ and $Yb_{0.9}La_{0.2}Ba_{1.9}Cu_3O_y$.

In addition, from the point of view of achieving satisfactory epitaxial growth of the barrier layer 14, it is preferable to set the substrate temperature at the time of depositing the barrier layer 14 in a range of 620° C. to 760° C. An inert gas, such as Ar gas and Ne gas, may be used for the gas atmosphere within a deposition chamber, and it is possible to further mix oxygen gas to such inert gases or, to sole use oxygen gas. Moreover, the pressure within the deposition chamber may be set in a range of 10 mTorr to 400 mTorr, for example. Preferably, the surfaces of the structure shown in FIG. 4C after removal of the resist layer 21, particularly the sloping surface of the lower electrode layer 12, are cleaned by exposure to oxygen plasma prior to forming the barrier layer 14.

When depositing the barrier layer 14 by PLD, it is preferable to set the laser irradiation energy in a range of 100 mJ/cm² to 600 mJ/cm², the pressure of the oxygen gas that is used as the gas atmosphere within the deposition chamber in a range of 10 mTorr to 200 mTorr, the substrate temperature in a range of 620° C. to 740° C., and the distance between the substrate 11 and the target (that is, the substrate-target distance) in a range of 40 mm to 100 mm. The barrier layer 14 can be formed to have the same composition as the target, but the composition of the barrier layer 14 may be changed by controlling the laser irradiation energy, the substrate-target distance or, the pressure within the deposition chamber. Such a control allows the Cu content to be set in a range of 35 At. % to 55 At. % and the AE content to be set in a range of 12 At. % to 30 At. % in the cations within the oxide material forming the barrier layer 14.

In the case of the barrier layer 14 made of the YBaCuO-based alloy, the Y content may be set in a range of 12 At. % to 30 At. % in the cations within the oxide material forming the barrier layer 14. In order to increase the Cu content of the barrier layer 14, for example, the substrate-target distance is decreased and the pressure within the deposition chamber is increased. In addition, in order to increase the Y content of the barrier layer 14, for example, the laser irradiation energy is increased and the substrate-target distance is increased.

The barrier layer 14 should cover the entire sloping surface portion of the lower electrode layer 12 to an extent such that the lower electrode layer 12 and the upper electrode layer 15 will not make direct contact with each other.

Next, in the process shown in FIG. 4E, the upper electrode layer 15 is formed to cover the surface of the barrier layer 14. The upper electrode layer 15 may be formed similarly to the lower electrode layer 12. The Josephson device 10 of this first embodiment having the superconducting junction 16 is formed by the above described processes. Of course, a protection layer made of Au, for example, may be formed on the upper electrode layer 15.

According to the method of forming the Josephson device in this first embodiment, the layer quality of the upper and lower electrode layers 15 and 12 in the vicinity of the barrier layer 14 becomes satisfactory and the IcRn product improves compared to those of the Josephson device having the barrier layer of the conventional IEJ, because the barrier layer 14 is formed by the deposition process. It is possible to avoid damages within the crystals and to suppress the current leak, even if the Cu content of the barrier layer 14 is high such that the current leak would otherwise be generated between the upper and lower electrode layers of the Josephson device using the conventional IEJ.

Figure 5:
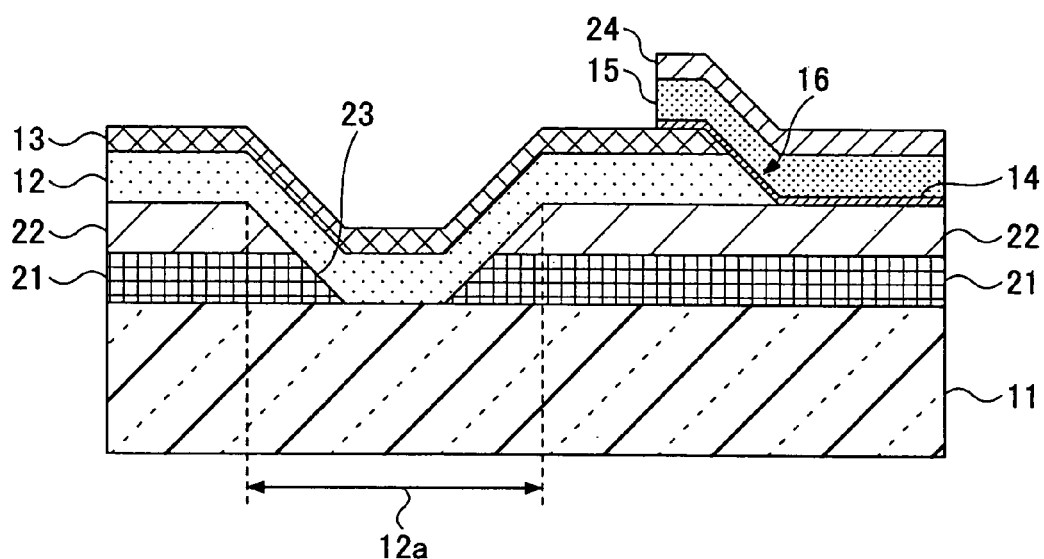
FIG. 5 is a cross sectional view showing a Josephson device in a modification of the first embodiment.

FIG. 5 is a cross sectional view showing a Josephson device in a modification of the first embodiment. In FIG. 5, those parts that are the same as those corresponding parts in FIGS. 2 and 4A through 4E will be designated by the same reference numerals, and a description thereof will be omitted.

As shown in FIG. 5, a Josephson device 20 in this modification of the first embodiment has a substrate 11, a ground plane layer 21 formed on the substrate 11, a first insulator layer 22 formed on the ground plane layer 21, a lower electrode layer 12 covering the first insulator layer 22 and also filling a penetration hole 23 penetrating the ground plane layer 21 and the first insulator layer 22, a second insulator layer 13 covering the lower electrode layer 12, a barrier layer 14, an upper electrode layer 15 covering the barrier layer 14, and a protection layer 24 covering the upper electrode layer 15. The barrier layer 14 covers a surface of the first insulating layer 22, a sloping surface formed at one end of each of the lower electrode layer 12 and the second insulator layer 13, and a surface of the second insulator layer 13. A superconducting junction 16 is formed by the lower electrode layer 12, the barrier layer 14 and the upper electrode layer 15.

The ground plane layer 21 may be made of a superconductor material similar to those used for the upper and lower electrode layers 15 and 12 shown in FIG. 2 or, may be made of a suitable material selected from other known oxide superconductor materials.

The first and second insulator layers 21 and 13 may be made of a material similar to that used for the insulator layer 13 shown in FIG. 2. The ground plane layer 21 has a function of blocking noise such as external electromagnetic waves in its superconducting state, and preventing an erroneous operation of the superconducting junction 16.

Other than the provision of the ground plane layer 21, the Josephson device 20 in this modification of the first embodiment is similar to the Josephson device 10 in the first embodiment shown in FIG. 2, and effects similar to those obtainable in the Josephson device 10 can also be obtained in the Josephson device 20.

Next, a description will be given of embodiment samples in accordance with this first embodiment, in comparison with comparison samples.

Embodiment Sample Emb1-1

Embodiment samples Emb1-1 were formed to have the same structure as the Josephson device 10 shown in FIG. 2 including the barrier layer 14 formed by the ramp-edge type deposition layer.

First, a $YBa_2Cu_3O_y$ layer was formed, as a lower electrode layer, on a MgO substrate to a thickness of 200 nm by magnetron sputtering using a $YBa_2Cu_3O_y$ target, at a substrate temperature of 740° C., an Ar+10 Vol. % $O_2$ atmosphere, and a pressure of 80 mTorr, where Vol. % denotes volume percent. Then, a $SrSnO_3$ layer was formed, as an insulator layer, on the lower electrode layer to a thickness of 250 nm by magnetron sputtering using a $SrSnO_3$ target, at a substrate temperature of 680° C., an Ar+50 Vol. % $O_2$ atmosphere, and a pressure of 50 mTorr.

Thereafter, the lower electrode layer and the insulator were etched by Ar ions using as a mask a resist layer having an opening formed by photolithography in a region where a superconducting junction is to be formed, so as to form a sloping surface by the lower electrode layer and the insulator layer. After removing the resist layer, surfaces of the $YBa_2Cu_3O_y$ lower electrode layer and the $SrSnO_3$ insulator layer were cleaned by oxygen plasma.

Then, a barrier layer was formed on the substrate, the sloping surface portion of the lower electrode layer, and the sloping surface portion and the surface of the insulator layer to a thickness of 1 nm by PLD, using a $Y_{0.9}Ba_{1.9}La_{0.2}Cu_3O_y$ target, a laser irradiation energy of 450 mJ/cm$^2$, an oxygen atmosphere, a pressure of 50 mTorr, and a substrate-target distance of 70 mm.

Next, a $Y_{0.9}Ba_{1.9}La_{0.2}Cu_3O_y$ layer was formed, as an upper electrode, on the barrier layer to a thickness of 200 nm by magnetron sputtering using a $Y_{0.9}Ba_{1.9}La_{0.2}Cu_3O_y$ target, a substrate temperature of 660° C., an oxygen atmosphere, and a pressure of 200 mTorr. Thereafter, a metal electrode was formed on the upper electrode layer by evaporation, and 16 Josephson devices were formed by a patterning process.

The current versus voltage characteristic of the 16 Josephson devices formed in this manner were measured at 4.2 K.

Figure 6A:
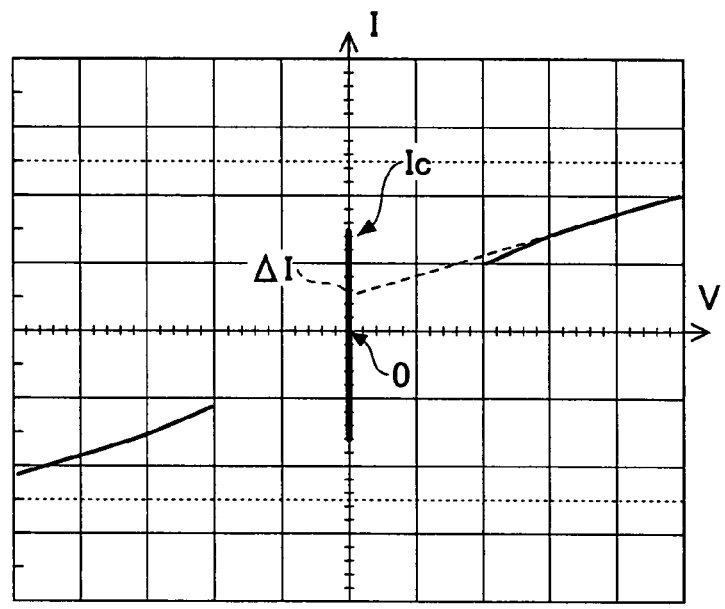
FIGS. 6A and 6B are diagrams showing a current versus voltage characteristic of the Josephson device for embodiment samples and comparison samples.
Figure 6B:
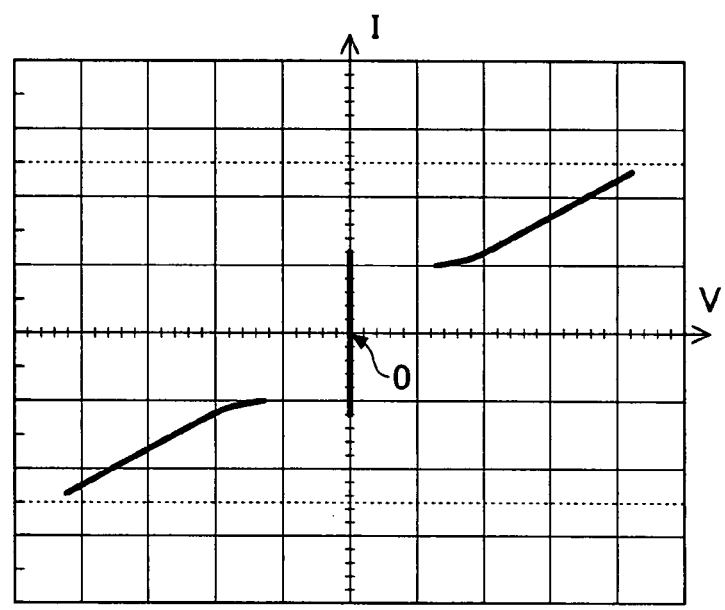

FIGS. 6A and 6B are diagrams showing a current versus voltage characteristic of the Josephson device for the embodiment samples Emb1-1 and comparison samples Cmp1-1, respectively. In FIGS. 6A and 6B, the ordinate indicates the current represented by 0.5 mA/scale, and the abscissa indicates the voltage represented by 1.0 mV/scale.

In the case of the embodiment samples Emb1-1, all 16 Josephson devices displayed a Resistivity Shunted Junction (RSJ) type current versus voltage characteristic. According to the RSJ type current versus voltage characteristic, a zero voltage state is obtained in a predetermined range even when a current is applied across the upper and lower electrode layers, and a superconducting current flows through the superconducting junction. When the current applied across the upper and lower electrode layers exceeds a predetermined value, a transition to a finite voltage state occurs discontinuously. A logic device can be formed by utilizing the switching between these states in the case of the Josephson device displaying the RSJ type current versus voltage characteristic, and such a characteristic is essential in logic circuits. FIG. 6A shows one example of the current versus voltage characteristic of the embodiment samples Emb1-1.

In addition, in the case of the embodiment samples Emb1-1, the IcRn product at 4.2 K was 3.0 mV to 4.0 mV, the average value of the critical current value Ic was 0.8 mA, and an excessive current component $\Delta I$ was 10% to 30% of the critical current value Ic. The excessive current component $\Delta I$ is the current value that is obtained by linearly extrapolating the curve in the finite voltage state shown in FIG. 6A to a zero voltage.

Furthermore, samples for analysis by a transmission electron microscope were made so that a cross section of the embodiment sample Emb1-1 is exposed. A composition analysis of the barrier layer was made using the transmission electron microscope and an EDX apparatus by setting the electron beam diameter to 1 nm. As a result of this composition analysis of the barrier layer, it was found that the Y content is 21 At. %, the Ba content is 33 At. %, the La content is 5 At. % and the Cu content is 41 At. % in the cations forming the barrier layer. A field emission type transmission electron microscope JEM-2010F (acceleration voltage of 200 kV) manufactured by JEOL Ltd. was used for the transmission electron microscope, and a Si (Li) semiconductor detector UTW manufactured by Thermo Fisher Scientific K.K. was used for the EDX apparatus. The composition analysis was made with respect to a region having a diameter of 1 nm. The composition analysis with respect to the embodiments and comparison samples described hereunder were also made using the same transmission electron microscope and EDX apparatus.

Comparison Sample Cmp1-1

Comparison samples Cmp1-1 were formed using targets having the same compositions as those used when forming the embodiment samples Emb1-1, except for the barrier layer, so as to obtain Josephson devices including a ramp-edge type IEJ.

First, a lower electrode layer and an insulator layer were formed on a substrate, and a sloping surface was formed on the lower electrode layer and the insulator layer, similarly to the embodiment samples Emb1-1.

Then, surfaces of the $YBa_2Cu_3O_y$ lower electrode layer and the $SrSnO_3$ insulator layer were cleaned by oxygen plasma. In addition, Ar ions were irradiated for 3 minutes at an acceleration voltage of 500V, so as to form a barrier layer on the sloping surface of the lower electrode layer.

Thereafter, an upper electrode layer and a metal layer were formed, and a patterning process was carried out, similarly to the embodiment samples Emb1-1, so as to form 16 Josephson devices. When the current versus voltage characteristic of the 16 Josephson devices formed in this manner were measured at 4.2 K, all 16 Josephson devices displayed an RSJ type current versus voltage characteristic such as that shown in FIG. 6B.

In addition, in the case of the comparison samples Cmp1-1, the IcRn product at 4.2 K was 2.0 mV to 2.5 mV, the average value of the critical current value Ic was 0.6 mA, and an excessive current component ΔI was 10% to 30% of the critical current value Ic.

Furthermore, when a composition analysis of the barrier layer of the comparison samples Cmp1-1 was made similarly to the composition analysis of the barrier layer of the embodiment samples Emb1-1 described above, it was found that the Y content is 19 At. %, the Ba content is 39 At. %, the La content is 12 At. % and the Cu content is 30 At. % in the cations forming the barrier layer.

When the embodiment samples Emb1-1 and the comparison samples Cmp1-1 are compared, it may be seen that the IcRn product of the embodiment samples Emb1-1 is larger than that of the comparison samples Cmp1-1 by 30% or more. It may be regarded that the improved IcRn product of the embodiment samples Emb1-1 is due to the increased Cu content (cation ratio) of the barrier layer, since the Cu content of the barrier layer of the embodiment samples Emb1-1 is 11 At. % larger than that of the comparison samples Cmp1-1.

Figure 7:
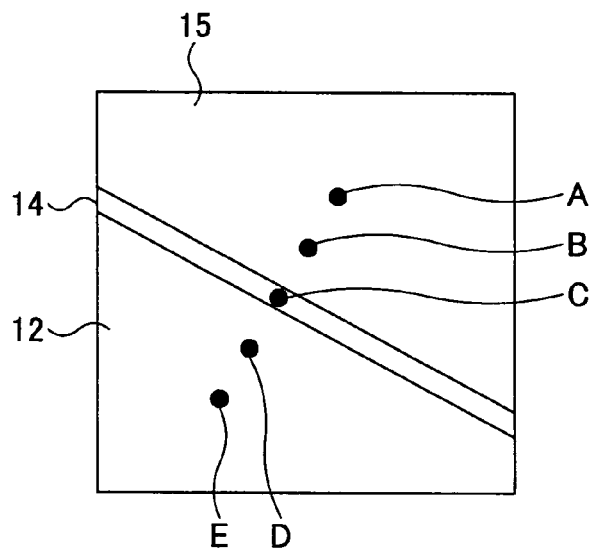
FIG. 7 is a cross sectional view, on an enlarged scale, showing a superconducting junction for explaining a composition analysis method for use in a vicinity of the barrier layer.

FIG. 7 is a cross sectional view, on an enlarged scale, showing a superconducting junction for explaining a composition analysis method for use in a vicinity of the barrier layer.

The composition analysis of the superconducting junction that is formed by the lower electrode, the barrier layer and the upper electrode layer of the comparison samples Cmp1-1 was made by irradiating an electron beam having a beam diameter of 1 nm perpendicularly to the cross section of the superconducting junction, similarly to the composition analysis made with respect to the embodiment samples Emb1-1, and analyzing the composition from the characteristic X-ray energy and intensity resulting from this electron beam irradiation. In FIG. 7, a beam position C indicates a center of the barrier layer along a direction in which the thickness of the barrier layer is taken, and beam positions D and E are positions deviated from the beam position C by 1.5 nm and 3.0 nm in a direction perpendicular to the surface of the barrier layer towards the lower electrode, respectively. In addition, beam positions B and A are positions deviated from the beam position C by 1.5 nm and 3.0 nm in the direction perpendicular to the surface of the barrier layer towards the upper electrode layer, respectively.

Figure 8:
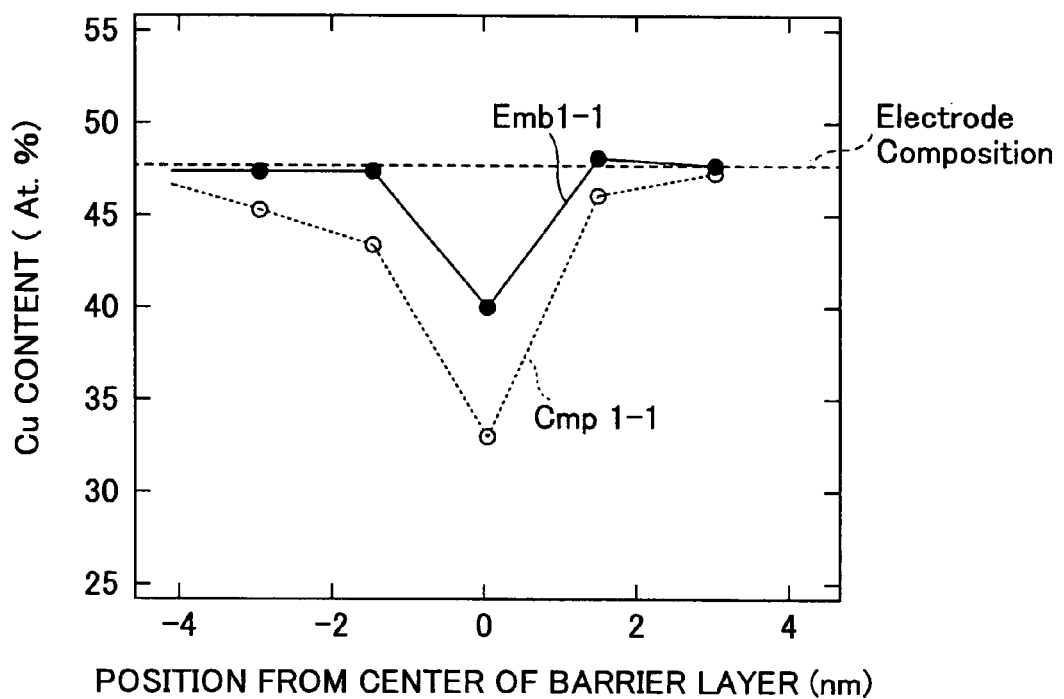
FIG. 8 is a diagram showing a Cu content distribution of the superconducting junction for each of embodiment samples Emb1-1 and comparison samples Cmp1-1.

FIG. 8 is a diagram showing a Cu content distribution of the superconducting junction for each of the embodiment samples Emb1-1 and the comparison samples Cmp1-1. In FIG. 8, the abscissa indicates the position from the center of the barrier layer, where a positive (+) side indicates the lower electrode layer and a negative (−) side indicates the upper electrode layer. The positions −3.0 nm, −1.5 nm, 0 nm, 1.5 nm and 3.0 nm from the center of the barrier layer in the direction perpendicular to the surface of the barrier layer correspond to the beam positions A, B, C, D and E shown in FIG. 7.

As may be seen from FIG. 8, a region where the Cu content of the barrier layer is lower than the electrode layer composition exists in a range of approximately −3.0 nm to approximately +3.0 nm for the comparison samples Cmp1-1. On the other hand, when the same composition analysis was made with respect to the embodiment samples Emb1-1, the Cu content of the barrier layer was lower than that of the electrode layer composition having a Cu content of 47.5 At. % at only the position 0 nm from the center of the barrier layer, and the Cu content of the barrier layer was approximately the same as that of the electrode layer composition at the positions ±1.5 nm and ±3.0 from the center of the barrier layer. It may be regarded that the IcRn product of the embodiment samples Emb1-1 is improved because the barrier layer of the embodiment samples Emb1-1 is extremely thin compared to that of the comparison samples Cmp1-1 and the Cu deficiency of the barrier layer virtually does not occur at the interfaces between the lower electrode layer and the barrier layer and between the barrier layer and the upper electrode layer. These effects are obtained by the embodiment samples Emb1-1 because the barrier layer thereof is a deposited layer.

Embodiment Sample Emb1-2

Embodiment samples Emb1-2 were formed using targets having the same compositions as those used when forming the embodiment samples Emb1-1, except for the barrier layer and the upper electrode layer, so as to obtain Josephson devices including a ramp-edge type barrier layer that is a deposited layer.

The barrier layer was formed on the substrate, the sloping surface portion of the lower electrode layer, and the sloping surface portion and the surface of the insulator layer to a thickness of 1.5 nm by PLD, using a YBa$_2$Cu$_3$O$_y$ target, at a laser irradiation energy of 450 mJ/cm$^2$, an oxygen atmosphere, a pressure of 50 mTorr, and a substrate-target distance of 80 mm.

In addition, the upper electrode layer was formed on the barrier layer to a thickness of 200 nm by magnetron sputtering, using a YBa$_2$Cu$_3$O$_y$ target, at a substrate temperature of 660° C., an oxygen atmosphere, and a pressure of 200 mTorr.

By carrying out a patterning process, 16 Josephson devices were formed. In the case of the embodiment samples Emb1-2, all 16 Josephson devices displayed an RSJ type current versus voltage characteristic.

In addition, in the case of the embodiment samples Emb1-2, the IcRn product at 4.2 K was 2.5 mV to 3.5 mV, the average value of the critical current value Ic was 0.6 mA, and an excessive current component ΔI was 10% to 30% of the critical current value Ic.

Furthermore, as a result of the composition analysis of the barrier layer, it was found that the Y content is 32 At. %, the Ba content is 33 At. % and the Cu content is 35 At. % in the cations forming the barrier layer.

Comparison Sample Cmp1-2

Comparison samples Cmp1-2 having the same structure as the comparison samples Cmp1-1 were formed using targets having the same compositions as those used when forming the embodiment samples Emb1-1, except for the barrier layer, so as to obtain Josephson devices including a ramp-edge type IEJ.

First, a lower electrode layer and an insulator layer were formed on a substrate, and a sloping surface was formed on the lower electrode layer and the insulator layer, similarly to the embodiment samples Emb1-1.

Then, surfaces of the YBa$_2$Cu$_3$O$_y$ lower electrode layer and the SrSnO$_3$ insulator layer were cleaned by oxygen plasma. In addition, Ar ions were irradiated for 3 minutes at an acceleration voltage of 500 V, so as to form a barrier layer on the sloping surface of the lower electrode layer.

Thereafter, an upper electrode layer and a metal layer were formed, and a patterning process was carried out, similarly to the embodiment samples Emb1-1, so as to form 10 Josephson devices. When the current versus voltage characteristic of the 10 Josephson devices formed in this manner were measured at 4.2 K, 8 Josephson devices displayed an FF type current versus voltage characteristic. In the FF type current versus voltage characteristic, the voltage makes a transition from the zero voltage state to the finite voltage state in an approximately continuous manner, and for this reason, a sufficient switching characteristic cannot be obtained thereby making the device unsuited for the logic device. On the other hand, 2 Josephson devices displayed an RSJ type current versus voltage characteristic, but the excessive current component $\Delta I$ was extremely large compared to that of the embodiment samples Emb1-1.

In addition, in the case of the comparison samples Cmp1-2, calculation of the IcRn product at 4.2 K was not possible because the resistance value Rn could not be derived. Moreover, the average value of the critical current value Ic was approximately 8 mA, and the excessive current component $\Delta I$ was 98% of the critical current value Ic.

Furthermore, when a composition analysis of the barrier layer of the comparison samples Cmp1-2 was made similarly to the composition analysis of the barrier layer of the embodiment samples Emb1-1 described above, it was found that the Y content is 29 At. %, the Ba content is 36 At. % and the Cu content is 35 At. % in the cations forming the barrier layer.

When the embodiment samples Emb1-2 and the comparison samples Cmp1-2 are compared, it may be seen that the Cu content is 35 At. % in the cations forming the barrier layer for each of the embodiment samples Emb1-2 and the comparison samples Cmp1-2, but the device characteristic of the Josephson devices according to the comparison samples Cmp1-2 were extremely poor compared to that of the Josephson devices according to the embodiment samples Emb1-2. It may be regarded that this is because the barrier layer of the embodiment samples Emb1-2 is a deposited layer, and a superconducting junction similar to that of the embodiment samples Emb1-1 is formed.

Comparison Sample Cmp1-3

Comparison samples Cmp1-3 having the same structure as the embodiment samples Emb1-1 were formed using targets having the same compositions as those used when forming the embodiment samples Emb1-1, so as to obtain Josephson devices including a ramp-edge type barrier layer that is a deposited layer.

The surfaces of the $YBa_2Cu_3O_y$ lower electrode layer and the $SrSnO_3$ insulator layer were cleaned by oxygen plasma. Then, a barrier layer was formed on the substrate, the sloping surface portion of the lower electrode layer, and the sloping surface portion and the surface of the insulator layer to a thickness of 0.5 nm by PLD, using a $Y_{0.9}Ba_{1.9}La_{0.2}Cu_3O_y$ target, at a laser irradiation energy of 600 mJ/cm$^2$, an oxygen atmosphere, a pressure of 150 mTorr, and a substrate-target distance of 50 mm.

A patterning process was carried out, similarly to the embodiment samples Emb1-1, so as to form 16 Josephson devices. When the current versus voltage characteristic of the 16 Josephson devices formed in this manner were measured at 4.2 K, all 16 Josephson devices displayed an FF type current versus voltage characteristic.

In addition, in the case of the comparison samples Cmp1-3, calculation of the IcRn product at 4.2 K was not possible because the resistance value Rn could not be derived. Moreover, the average value of the critical current value Ic was approximately 10 mA or larger.

Furthermore, when a composition analysis of the barrier layer of the comparison samples Cmp1-3 was made similarly to the composition analysis of the barrier layer of the embodiment samples Emb1-1 described above, it was found that the Y content is 15 At. %, the Ba content is 26 At. % the La content is 3 At. % and the Cu content is 56 At. % in the cations forming the barrier layer.

Comparison Sample Cmp1-4

Comparison samples Cmp1-4 having the same structure as the embodiment samples Emb1-1 were formed using targets having the same compositions as those used when forming the embodiment samples Emb1-1, so as to obtain Josephson devices including a ramp-edge type barrier layer that is a deposited layer.

The surfaces of the $YBa_2Cu_3O_y$ lower electrode layer and the $SrSnO_3$ insulator layer were cleaned by oxygen plasma. Then, a barrier layer was formed on the substrate, the sloping surface portion of the lower electrode layer, and the sloping surface portion and the surface of the insulator layer to a thickness of 3 nm by PLD, using a $Y_{0.9}Ba_{1.9}La_{0.2}Cu_3O_y$ target, at a laser irradiation energy of 400 mJ/cm$^2$, an oxygen atmosphere, a pressure of 50 mTorr, and a substrate-target distance of 90 mm.

A patterning process was carried out, similarly to the embodiment samples Emb1-1, so as to form 16 Josephson devices. When the current versus voltage characteristic of the 16 Josephson devices formed in this manner were measured at 4.2 K, all 16 Josephson devices displayed an RSJ type current versus voltage characteristic.

In addition, in the case of the comparison samples Cmp1-4, the IcRn product at 4.2 K was 1.0 mV to 2.0 mV, the average value of the critical current value Ic was 0.5 mA, and an excessive current component $\Delta I$ was 10% to 30% of the critical current value Ic.

Furthermore, when a composition analysis of the barrier layer of the comparison samples Cmp1-4 was made similarly to the composition analysis of the barrier layer of the embodiment samples Emb1-1 described above, it was found that the Y content is 27 At. %, the Ba content is 40 At. % the La content is 3 At. % and the Cu content is 30 At. % in the cations forming the barrier layer.

Comparison Sample Cmp1-5

Comparison samples Cmp1-5 having the same structure as the embodiment samples Emb1-1 were formed using targets having the same compositions as those used when forming the embodiment samples Emb1-1, so as to obtain Josephson devices including a ramp-edge type barrier layer that is a deposited layer.

The surfaces of the $YBa_2Cu_3O_y$ lower electrode layer and the $SrSnO_3$ insulator layer were cleaned by oxygen plasma. Then, a barrier layer was formed on the substrate, the sloping surface portion of the lower electrode layer, and the sloping surface portion and the surface of the insulator layer to a thickness of 5 nm by PLD, using a $Y_{0.96}Ba_{1.9}La_{0.2}Cu_3O_y$ target, at a laser irradiation energy of 500 mJ/cm$^2$, an oxygen atmosphere, a pressure of 100 mTorr, and a substrate-target distance of 70 mm.

A patterning process was carried out, similarly to the embodiment samples Emb1-1, so as to form 16 Josephson devices. When the current versus voltage characteristic of the 16 Josephson devices formed in this manner were measured at 4.2 K, all 16 Josephson devices displayed an RSJ type current versus voltage characteristic.

In addition, in the case of the comparison samples Cmp1-5, the IcRn product at 4.2 K was 0.4 mV to 1.0 mV, and the average value of the critical current value Ic was 0.1 mA.

Furthermore, when a composition analysis of the barrier layer of the comparison samples Cmp1-5 was made similarly to the composition analysis of the barrier layer of the embodiment samples Emb1-1 described above, it was found that the Y content is 31 At. %, the Ba content is 40 At. % the La content is 3 At. % and the Cu content is 60 At. % in the cations forming the barrier layer.

Comparison Sample Cmp1-6

Comparison samples Cmp1-6 having the same structure as the embodiment samples Emb1-1 were formed using targets having the same compositions as those used when forming the embodiment samples Emb1-1, so as to obtain Josephson devices including a ramp-edge type barrier layer that is a deposited layer.

The surfaces of the $YBa_2Cu_3O_y$ lower electrode layer and the $SrSnO_3$ insulator layer were cleaned by oxygen plasma. Then, a barrier layer was formed on the substrate, the sloping surface portion of the lower electrode layer, and the sloping surface portion and the surface of the insulator layer to a thickness of 3 nm by PLD, using a $Y_{0.9}Ba_{1.9}La_{0.2}Cu_3O_y$ target, at a laser irradiation energy of 400 mJ/cm$^2$, an oxygen atmosphere, a pressure of 400 mTorr, and a substrate-target distance of 50 mm.

A patterning process was carried out, similarly to the embodiment samples Emb1-1, so as to form 16 Josephson devices. When the current versus voltage characteristic of the 16 Josephson devices formed in this manner were measured at 4.2 K, all 16 Josephson devices displayed an FF type current versus voltage characteristic.

In addition, in the case of the comparison samples Cmp1-6, calculation of the IcRn product at 4.2 K was not possible because the resistance value Rn could not be derived. Moreover, the average value of the critical current value Ic was approximately 7 mA, and the excessive current component ΔI was 98% of the critical current value IC.

Furthermore, when a composition analysis of the barrier layer of the comparison samples Cmp1-6 was made similarly to the composition analysis of the barrier layer of the embodiment samples Emb1-1 described above, it was found that the Y content is 11 At. %, the Ba content is 33 At. % the La content is 3 At. % and the Cu content is 53 At. % in the cations forming the barrier layer.

Embodiment Sample Emb2

Embodiment samples Emb2 were formed similarly to the embodiment samples Emb1-1, except for the lower electrode layer, the barrier layer and the upper electrode layer that were formed using a $SmBa_2Cu_3O_y$ target, so as to obtain Josephson devices including a ramp-edge type barrier layer that is a deposited layer.

The lower electrode layer was formed to a thickness of 200 nm by magnetron sputtering using a $SmBa_2Cu_3O_y$ target, at a substrate temperature of 780° C., an Ar+10 Vol. % $O_2$ atmosphere, and a pressure of 100 mTorr.

The barrier layer was formed on the substrate, the sloping surface portion of the lower electrode layer, and the sloping surface portion and the surface of the insulator layer to a thickness of 1 nm by PLD, using a $SmBa_2Cu_3O_y$ target, at a laser irradiation energy of 500 mJ/cm$^2$, an oxygen atmosphere, a pressure of 50 mTorr, and a substrate-target distance of 60 mm.

The upper electrode layer was formed to a thickness of 200 nm by magnetron sputtering using a $SmBa_2Cu_3O_y$ target, at a substrate temperature of 760° C., an Ar+10 Vol. % $O_2$ atmosphere, and a pressure of 100 mTorr.

By carrying out a patterning process, 16 Josephson devices were formed. In the case of the embodiment samples Emb1-2, all 16 Josephson devices displayed an RSJ type current versus voltage characteristic.

In addition, in the case of the embodiment samples Emb2, the IcRn product at 4.2K was 3.0 mV to 3.8 mV, the average value of the critical current value Ic was 0.9 mA, and an excessive current component ΔI was 30% of the critical current value Ic.

Furthermore, as a result of the composition analysis of the barrier layer, it was found that the Sm content is 23 At. %, the Ba content is 32 At. % and the Cu content is 45 At. % in the cations forming the barrier layer.

Embodiment Sample Emb3

Embodiment samples Emb3 were formed similarly to the embodiment samples Emb1-1, except for the lower electrode layer was formed using a $Y_{0.9}Ba_{1.9}La_{0.2}Cu_3O_y$ target, the barrier layer was formed using a $Yb_{0.9}Ba_{1.9}La_{0.2}Cu_3O_y$ target, the upper electrode layer was formed using a $Yb_{0.9}Ba_{1.9}La_{0.2}Cu_3O_y$ target, and the thickness of the barrier layer was made different from the thicknesses of the upper and lower electrode layers, so as to obtain Josephson devices including a ramp-edge type barrier layer that is a deposited layer.

The lower electrode layer was formed to a thickness of 200 nm by magnetron sputtering using the $Y_{0.9}Ba_{1.9}La_{0.2}Cu_3O_y$ target, at a substrate temperature of 740° C., an Ar+10 Vol. % $O_2$ atmosphere, and a pressure of 80 mTorr.

The barrier layer was formed on the substrate, the sloping surface portion of the lower electrode layer, and the sloping surface portion and the surface of the insulator layer to a thickness in a range of 0.5 nm to 5 nm by PLD, using the $Yb_{0.9}Ba_{1.9}La_{0.2}Cu_3O_y$ target, at a laser irradiation energy of 450 mJ/cm$^2$, an oxygen atmosphere, a pressure of 70 mTorr, and a substrate-target distance of 70 mm. The thickness of the barrier layer was determined from photographs of the cross section in the vicinity of the superconducting junction taken by the transmission electron microscope.

The upper electrode layer was formed to a thickness of 200 nm by magnetron sputtering using the $Yb_{0.9}Ba_{1.9}La_{0.2}Cu_3O_y$ target, at a substrate temperature of 660° C., an oxygen atmosphere, and a pressure of 200 mTorr.

Figure 9:
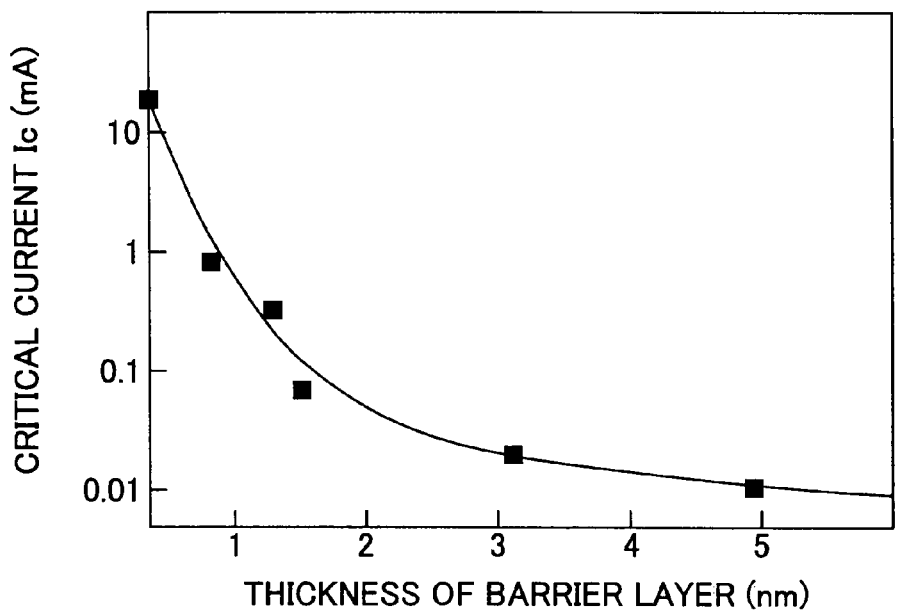
FIG. 9 is a diagram showing a relationship between a critical current and a barrier layer thickness for embodiment samples Emb3 at 4.2 K.

FIG. 9 is a diagram showing a relationship between the critical current and the barrier layer thickness in for the embodiment samples Emb3 at 4.2 K.

As may be seen from FIG. 9, the critical current value Ic decreased when the thickness of the barrier layer increased. It was thus confirmed that when the barrier layer is a deposited layer, the critical current value Ic of the Josephson device can be controlled by varying the thickness of the barrier layer.

In addition, in the case of the embodiment samples Emb3 with the barrier layer thickness of 1 nm, the IcRn product at 4.2 K was 2.6 mV to 3.4 mV, and an excessive current component ΔI was 5% to 30% of the critical current value Ic.

Furthermore, as a result of the composition analysis of the barrier layer, it was found that the combined content of the Y atoms and the Yb atoms is 17 At. %, the Ba content is 27 At. %, the La content is 4 At. % and the Cu content is 52 At. % in the cations forming the barrier layer.

Comparison Sample Cmp3

Comparison samples Cmp3 were formed using targets having the same compositions as those used when forming the embodiment samples Emb3, except for the barrier layer, so as to obtain Josephson devices including a ramp-edge type IEJ.

First, the lower electrode layer and the insulator layer were formed on the substrate, and a sloping surface was formed on the lower electrode layer and the insulator layer, similarly to the embodiment samples Emb3.

Then, surfaces of the $Y_{0.9}Ba_{1.9}La_{0.2}Cu_3O_y$ lower electrode layer and the $SrSnO_3$ insulator layer were cleaned by oxygen plasma. In addition, Ar ions were irradiated for 3 minutes at an acceleration voltage of 500 V, so as to form a barrier layer on the sloping surface of the lower electrode layer.

Thereafter, a $Yb_{0.9}Ba_{1.9}La_{0.2}Cu_3O_y$ upper electrode layer and a metal layer were formed, and a patterning process was carried out, similarly to the embodiment samples Emb3, so as to form Josephson devices.

Figure 10:
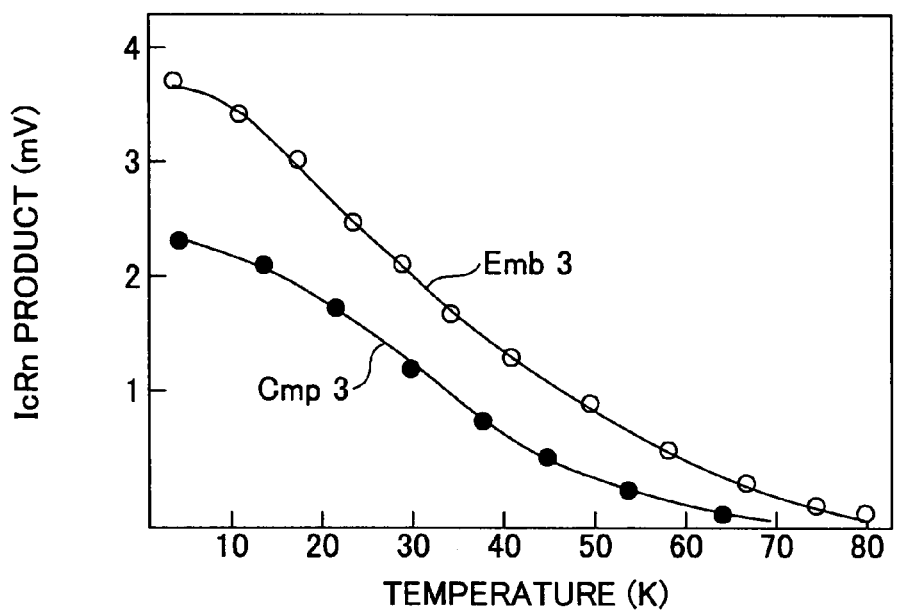
FIG. 10 is a diagram showing a relationship between the IcRn product and the temperature for each of embodiment samples Emb3 and comparison samples Cmp3.

FIG. 10 is a diagram showing a relationship between the IcRn product and the temperature for each of the embodiment samples Emb3 and the comparison samples Cmp3. FIG. 10 shows the relationship for a case where the thickness of the barrier layer is 1 nm for the embodiment samples Emb3.

As may be seen from FIG. 10, the IcRn product of the embodiment samples Emb3 is greater than that of the comparison samples Cmp3 at all temperatures in a range of 4.2 K to 80 K, and it was confirmed that the embodiment samples Emb3 are superior compared to the comparison samples Cmp3 having the conventional IEJ throughout a wide temperature range. In addition, it was confirmed that the critical temperature of the embodiment samples Emb3 is higher than that of the comparison samples Cmp3, and that the embodiment samples Emb3 can operate at a higher temperature than the comparison samples Cmp3.

Embodiment Sample Emb4

Embodiment samples Emb4 were formed to have the same structure as the Josephson device 20 shown in FIG. 5 including the barrier layer 14 formed by the ramp-edge type deposition layer. A $YBa_2Cu_3O_{y\,layer}$ was used for the ground plane layer, and $Y_{0.9}Ba_{1.9}La_{0.2}Cu_3O_y$ layers were used for the upper and lower electrode layers.

First, a $YBa_2Cu_3O_y$ layer was formed, as a ground plane layer, on a MgO substrate to a thickness of 200 nm by magnetron sputtering using a $YBa_2Cu_3O_y$ target, and a $SrSnO_3$ layer was formed, as a first insulator layer, on the ground plane layer to a thickness of 250 nm using a $SrSnO_3$ target, at a substrate temperature of 740° C., an Ar+10 Vol. % $O_2$ atmosphere, and a pressure of 80 mTorr.

Next, a resist mask having an opening at the surface of the first insulator layer was formed by photolithography, and a penetration hole was formed in the first insulator layer and the ground plane layer by dry etching.

Thereafter, a $Y_{0.9}Ba_{1.9}La_{0.2}Cu_3O_y$ layer was formed, as a lower electrode layer, on the first insulator layer to a thickness of 200 nm by magnetron sputtering using a $Y_{0.9}Ba_{1.9}La_{0.2}Cu_3O_y$ target, at a substrate temperature of 720° C., an Ar+10 Vol. % $O_2$ atmosphere, and a pressure of 80 mTorr. Then, a $SrSnO_3$ layer was formed, as a second insulator layer, on the lower electrode layer to a thickness of 250 nm by magnetron sputtering using a $SrSnO_3$ target, at a substrate temperature of 680° C., an Ar+50 Vol. % $O_2$ atmosphere, and a pressure of 50 mTorr.

Thereafter, the lower electrode layer and the second insulator layer were etched by Ar ions using as a mask a resist layer having an opening formed by photolithography in a region where a superconducting junction is to be formed, similarly to the embodiment samples Emb1-1, so as to form a sloping surface by the lower electrode layer and the second insulator layer. After removing the resist layer, surfaces of the $YBa_2Cu_3O_y$ lower electrode layer and the $SrSnO_3$ second insulator layer were cleaned by oxygen plasma.

Then, a barrier layer was formed on the substrate, the sloping surface portion of the lower electrode layer, and the sloping surface portion and the surface of the second insulator layer to a thickness of 1 nm by PLD, using a $Y_{0.9}Ba_{1.9}La_{0.2}Cu_3O_y$ target, a laser irradiation energy of 450 mJ/cm², an oxygen atmosphere, and a pressure of 50 mTorr.

Next, a $Y_{0.9}Ba_{1.9}La_{0.2}Cu_3O_y$ layer was formed, as an upper electrode, on the barrier layer to a thickness of 200 nm by magnetron sputtering using a $Y_{0.9}Ba_{1.9}La_{0.2}Cu_3O_y$ target, a substrate temperature of 660° C., an oxygen atmosphere, and a pressure of 200 mTorr. Thereafter, a metal electrode was formed on the upper electrode layer by evaporation, and 16 Josephson devices were formed by a patterning process.

All 16 Josephson devices formed in this manner displayed the RSJ type current versus voltage characteristic.

In addition, in the case of the embodiment samples Emb4, the IcRn product at 4.2 K was 3.0 mV to 3.9 mV, the average value of the critical current value Ic was 0.8 mA, and an excessive current component $\Delta I$ was 10% to 30% of the critical current value Ic. The IcRn product was thus approximately 30% greater than the value conventionally reported.

As a result of a composition analysis of the barrier layer, it was found that the Y content is 22 At. %, the Ba content is 34 At. %, the La content is 5 At. % and the Cu content is 39 At. % in the cations forming the barrier layer.

Figure 11:
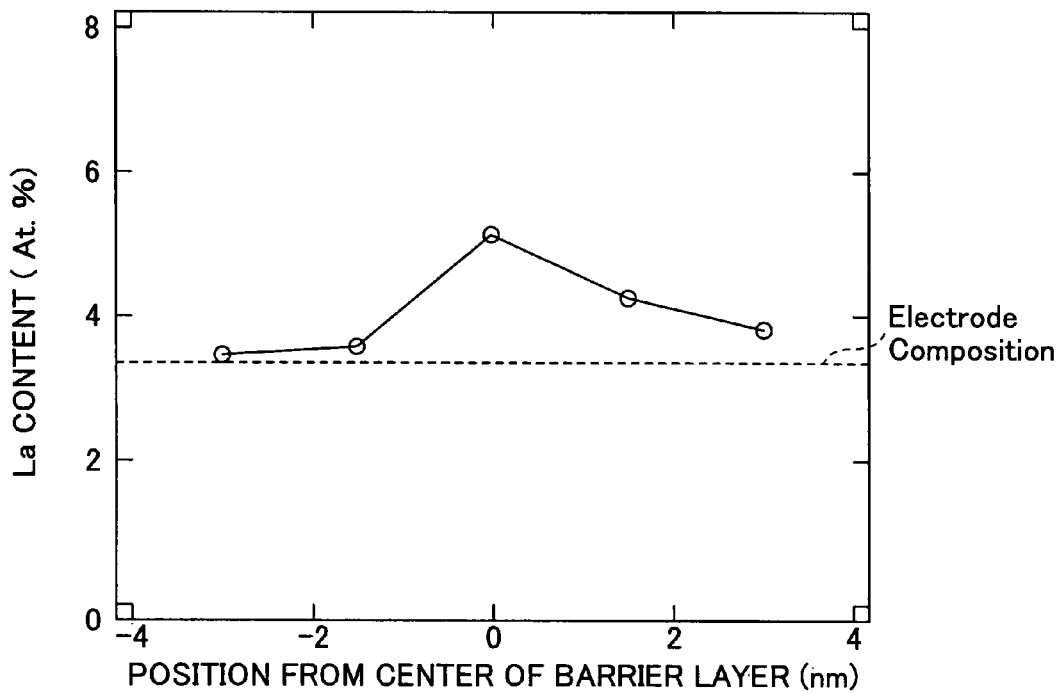
FIG. 11 is a diagram showing an La element distribution of the superconducting junction for embodiment samples Emb4.

FIG. 11 is a diagram showing an La element distribution of the superconductor junction for the embodiment samples Emb4. In FIG. 11, the abscissa indicates the position from the center of the barrier layer, where a positive (+) side indicates the lower electrode layer and a negative (−) side indicates the upper electrode layer. The positions −3.0 nm, −1.5 nm, 0 nm, 1.5 nm and 3.0 nm from the center of the barrier layer in the direction perpendicular to the surface of the barrier layer correspond to the beam positions A, B, C, D and E shown in FIG. 7.

As may be seen from FIG. 11, the La content of the barrier layer in a range of ±1.5 nm from the center of the barrier layer was 1.5 times that of each of the upper and lower electrode layers, and it was confirmed that the La content of the barrier layer is considerably increased. Because the ion diameter of La is greater than those of Y, Ba and Cu, it may be regarded that a junction interface where the composition sharply changes is formed between the barrier layer and the lower electrode layer or the upper electrode layer. Phenomena similar to such a phenomenon encountered for La have been confirmed for rare earth elements having an ion diameter greater than 0.95 Å, such as Pr, Nd, Sm and Eu.

Comparison Sample Cmp4

Comparison samples Cmp4 were formed using targets having the same compositions as those used when forming the embodiment samples Emb4, except for the barrier layer, so as to obtain Josephson devices including a ramp-edge type IEJ.

First, a ground plane layer, a first insulator layer, a lower electrode layer that fills a penetration hole in the first insulator layer and the ground plane layer and also covers the surface of the first insulator layer, and a second insulator layer that coverts he lower electrode layer were successively formed on a substrate, similarly to the embodiment samples Emb4.

Then, a sloping surface was formed on the lower electrode layer and the second insulator layer, and surfaces of the lower electrode layer and the $SrSnO_3$ second insulator layer were cleaned by oxygen plasma.

Thereafter, a barrier layer was formed on the sloping surface portion of the lower electrode layer by irradiating Ar ions at an acceleration voltage of 500 V.

Next, an upper electrode and a metal layer were formed on the barrier layer by evaporation, similarly to the embodiment samples Emb4, and 16 Josephson devices were formed by a patterning process.

All 16 Josephson devices formed in this manner displayed the RSJ type current versus voltage characteristic.

In addition, in the case of the comparison samples Cmp4, the IcRn product at 4.2 K was 1.5 mV to 2.2 mV, the average value of the critical current value Ic was 1.3 mA, and an excessive current component ΔI was 15% to 30% of the critical current value Ic.

As a result of a composition analysis of the barrier layer, it was found that the Y content is 27 At. %, the Ba content is 42 At. %, the La content is 3 At. % and the Cu content is 28 At. % in the cations forming the barrier layer.

By comparing the embodiment samples Emb4 and the comparison samples Cmp4, it was found that the critical current value Ic at 4.2 K is approximately the same for the two, but the IcRn product of the embodiment samples Emb4 is 1.3 times to 1.6 times that of the comparison samples Cmp4 and large compared to the comparison samples Cmp4.

Second Embodiment

A Josephson device in a second embodiment of the present invention has a stacked structure.

Figure 12:
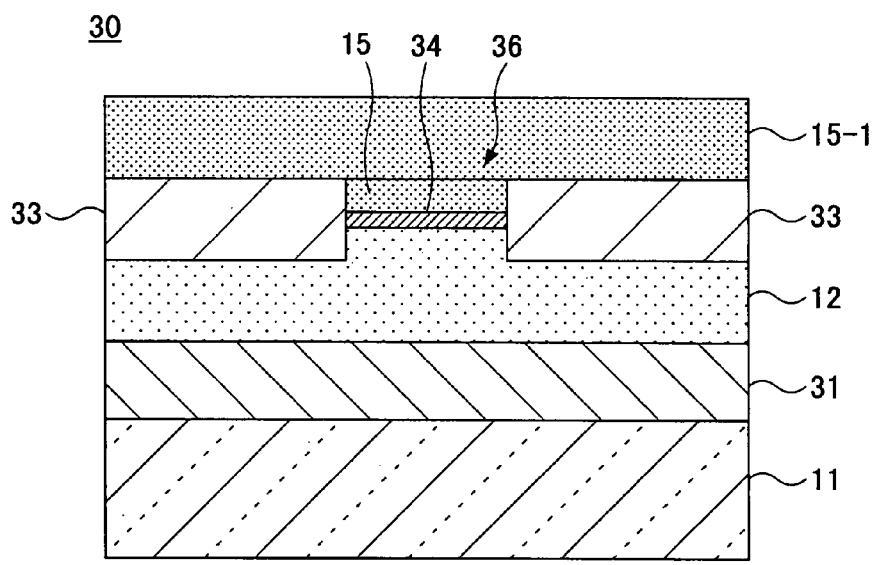
FIG. 12 is a cross sectional view showing a Josephson device in a second embodiment according to the present invention.

FIG. 12 is a cross sectional view showing the Josephson device in this second embodiment according to the present invention. In FIG. 12, those parts that are the same as those corresponding parts in FIG. 2, FIGS. 4A through 4E and FIG. 5 are designated by the same reference numerals, and a description thereof will be omitted.

A Josephson device 30 of this second embodiment shown in FIG. 12 has a substrate 11, a buffer layer 31 formed on the substrate 11, a lower electrode layer 12 formed on the buffer layer 31, a barrier layer 34 covering a portion of the lower electrode layer 12, an insulator layer 33 covering the surface of the lower electrode layer 12 other than the surface having the barrier layer 34 formed thereon, and an upper electrode layer 15 covering the barrier layer 34 and the insulator layer 33. The lower electrode layer 12, the barrier layer 34 and the upper electrode layer 15 form a superconducting junction 36. The basic structure of each of the upper and lower electrode layers 15 and 12 is the Perovskite structure, and the atomic plane made up of copper and oxygen is preferably formed perpendicularly to the surface of the substrate 11 (that is, the substrate surface).

The buffer layer 31 is grown epitaxially on the surface of the substrate 11, and the lower electrode layer 12 is grown epitaxially on the buffer layer 31. The buffer layer 31 is made of a suitable material that orients the c-axis of the lower electrode layer 12 in a direction parallel to the substrate surface. The material used for the buffer layer 31 may be selected from oxide materials having the Perovskite structure, such as $PrGaO_3$, $SrTiO_3$ and $NdGaO_3$.

From the point of view of satisfactorily growing the buffer layer 31 epitaxially on the substrate 11, the substrate 11 is preferably made of $SrTiO_3$, LSAT, $LaAlO_3$, $NdGaO_3$ and the like.

The insulator 33 is made of a material similar to that used for the buffer layer 31. The insulator layer 33 is grown epitaxially on the lower electrode layer 12.

The barrier layer 34 is made of a material similar to that used for the barrier layer 14 of the first embodiment shown in FIG. 2. In other words, the barrier layer 34 includes the element RE, the element AE, Cu and oxygen. In the barrier layer 34, the element RE is at least one element selected from a group consisting of Y, La, Pr, Nd, Sm, Eu, Gd, Dy, Ho, Er, Tm, Yb and Lu, and the element AE is at least one element selected from a group consisting of Ba, Sr and Ca. In addition, in the cations within the oxide material forming the barrier layer 34, the Cu content is set in a range of 35 At. % to 55 At. %, the RE content is set in a range of 12 At. % to 30 At. %, and further, the composition of the barrier layer 34 is different from the compositions of the upper and lower electrode layers 15 and 12.

Because the barrier layer 34 has this composition and is a deposited layer, similarly to the barrier layer 14 of the first embodiment, it is possible to improve the IcRn product of the Josephson device 30. In addition, the a-axis and the b-axis of the upper and lower electrode layers 15 and 12 become perpendicular to the substrate surface. Since the current flows more easily along the a-axis and the b-axis of the oxide superconductor material, it is possible to increase the critical current value Ic and to improve the IcRn product by making the a-axis and the b-axis of the upper and lower electrode layers 15 and 12 perpendicular to the junction surface, as compared to the case where the a-axis and the b-axis of the upper and lower electrode layers 15 and 12 are not perpendicular to the junction surface. Therefore, according to this second embodiment, it is possible to realize the Josephson device 30 having the stacked structure and improved IcRn product.

Next, a description will be given of the method of forming the Josephson device in the second embodiment, by referring to FIG. 12.

First, the buffer layer 31, the lower electrode layer 12, the barrier layer 34 and the upper electrode layer 15 are successively deposited on the substrate 11 that is made of $SrTiO_3$, for example. The buffer layer 31, the lower electrode layer 12 and the upper electrode layer 15 may be formed by vacuum deposition, sputtering, PLD or CVD. For example, the buffer layer 31 is deposited to a thickness of 20 nm by sputtering using a $PrGaO_3$ target. For example, the lower electrode layer 12 is deposited by sputtering using a $YBa_2Cu_3O_y$ target at a substrate temperature of 600° C. and in a depressurized atmosphere of 50 Vol. % oxygen gas and 50 Vol. % Ar gas at a pressure of 20 Pa. The barrier layer 34 is formed similarly to the barrier layer 14 of the first embodiment, and for example, the barrier layer 34 is deposited to a thickness of 3 nm by PLD using a $YBa_2Cu_3O_y$ target.

Thereafter, a resist layer (not shown), that covers a region where the superconductor junction 36 is to be formed, is formed by photolithography. Further, an etching process is carried out by Ar ion irradiation to remove portions of the upper electrode layer 15, the barrier layer 34 and the lower electrode layer 12.

Then, the insulator layer 33 that covers the lower electrode layer 12 and the superconducting junction 36 is formed similarly to the buffer layer 31, and a lift-off process is carried out to remove the resist layer and the unnecessary portion of the insulator layer 33 formed on the resist layer.

Next, a second upper electrode layer 15-1 is formed to cover the upper electrode layer 15 and the insulator layer 33. The second upper electrode layer 15-1 is formed similarly to the lower electrode layer 12. Although omitted in FIG. 12, an electrode pad is formed on the surface of the second upper electrode layer 15-1. The Josephson device 30 having the stacked structure is formed in this manner.

Third Embodiment

Figure 13:
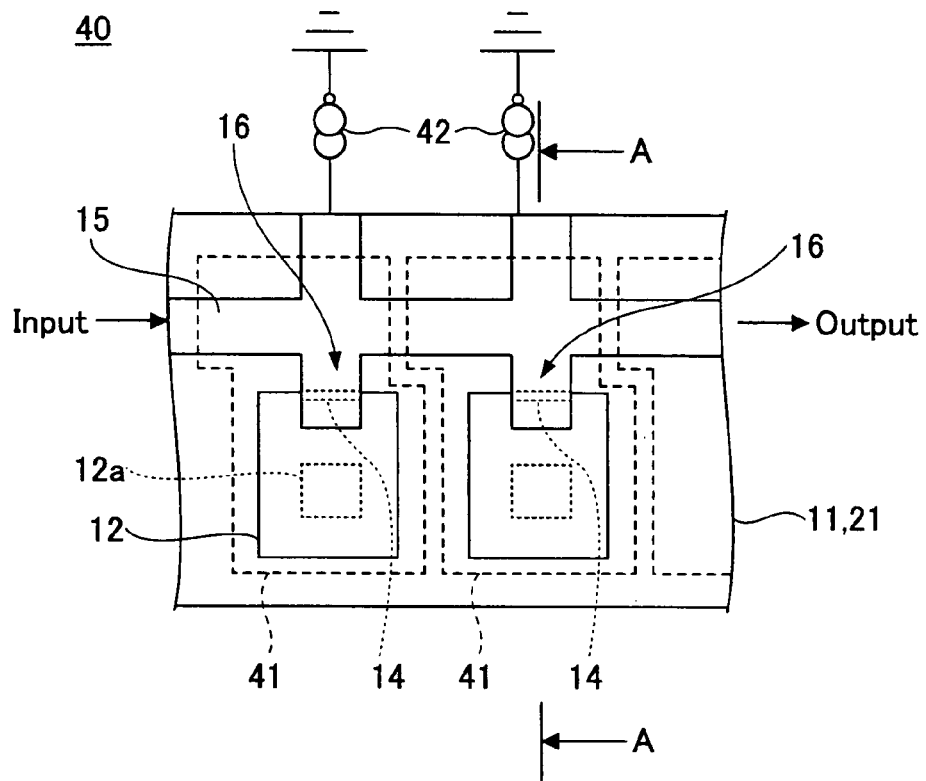
FIG. 13 is a cross sectional view showing a superconductor circuit in a third embodiment of the present invention.
Figure 14:
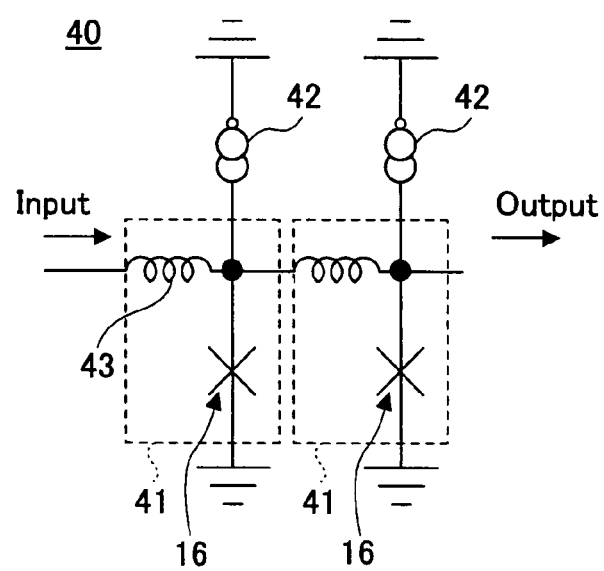
FIG. 14 is a circuit diagram showing an equivalent circuit of the superconductor circuit shown in FIG. 13.

FIG. 13 is a cross sectional view showing a superconductor circuit (or superconducting junction circuit) in a third embodiment of the present invention, and FIG. 14 is a circuit diagram showing an equivalent circuit of the superconductor circuit shown in FIG. 13. FIG. 5 described above corresponds to a cross section taken along a line A-A in FIG. 13. In FIGS. 13 and 14, those parts that are the same as those corresponding parts in FIG. 5 are designated by the same reference numerals, and a description thereof will be omitted.

As may be seen from FIGS. 5, 13 and 14, a superconductor circuit 40 of this third embodiment includes a superconductor junction line connecting 2 Josephson devices 41. As shown in FIG. 14, the Josephson devices 41 of the superconductor circuit 40 are connected so that inductances 43 thereof are connected in series and a D.C. current source 42 and a superconductor junction 15 are connected to a node that connects the inductances 43.

The superconductor circuit 40 has the structure shown in FIG. 5. The materials used for the substrate 11, the lower electrode layer 12, the barrier layer 14 and the upper electrode layer 15 are the same as those used for the substrate 11, the lower electrode layer 12, the barrier layer 14 and the upper electrode layer 15 of the Josephson device 10 shown in FIG. 2. In addition, the material used for the first and second insulator layers 22 and 13 is the same as that used for the insulator layer 13 of the Josephson device 10 shown in FIG. 2.

The lower electrode layer 12, the barrier layer 14 and the upper electrode layer 15 form the ramp-edge type superconducting junction 16. Of course, the Josephson device in this third embodiment may have the stacked structure of the second embodiment described above.

As shown in FIG. 13, the upper electrode layer of the Josephson device 41 forms the superconducting junction 16 between the upper and lower electrode layers 15 and 12 via the barrier layer 14 with a predetermined junction width. The upper electrode layer 15 connects the Josephson devices 41, and forms the inductor 43 shown in FIG. 14. In addition, a bias current from the D.C. current source 42 is supplied to the Josephson device 41 via the upper electrode layer 15.

The lower electrode layer 12 contacts the ground plane layer 21 via the penetration hole 23 that is formed in a portion of the first insulator layer 22. Although not shown in FIGS. 13 and 14, the ground plane layer 21 is grounded.

The basic operation of the superconductor circuit 40 is as follows. That is, when a current pulse accompanying magnetic flux quantum is supplied from the input end, this current pulses is superimposed on the bias current that flows through the superconducting junction 16 shown on the left side in FIG. 13, and as shown in FIG. 7 described above, a switching occurs from the "zero voltage state" which is a superconducting state to the "finite voltage state" when the current flowing through the left superconducting junction 16 exceeds the critical current value Ic. In addition, by this switching of the left superconducting junction 16 to the "finite voltage state", the current pulse accompanying the magnetic flux quantum flows through the superconducting junction shown on the right side in FIG. 13, and a switching from the "zero voltage state" to the "finite voltage state" occurs with respect to the right superconducting junction 16 by an operation similar to that described with respect to the left superconducting junction 16. Accordingly, the magnetic flux quantum is successively transferred to the adjacent Josephson devices 41. In the superconductor circuit 40, the magnitude of the critical current value Ic can be controlled by varying the thickness of the barrier layer 14.

The superconductor circuit 40 of this third embodiment can operate at a high speed because the Josephson devices 41 have the IcRn product that is large compared to that of the conventional Josephson devices. In addition, because the critical temperature of the superconducting junction 16 is high, the superconductor circuit 40 can operate at a high temperature, and as a result, it is possible to reduce the cooling cost and the size of the apparatus.

This application claims the benefit of a Japanese Patent Application No. 2006-226938 filed Aug. 23, 2006, in the Japanese Patent Office, the disclosure of which is hereby incorporated by reference.

Further, the present invention is not limited to these embodiments, but various variations and modifications may be made without departing from the scope of the present invention.

What is claimed is:

1. A Josephson device comprising:
a substrate having a surface;
a first superconducting electrode layer formed on the surface of the substrate;
an insulator formed on the first superconducting electrode layer and having a penetration hole penetrating the insulator layer in a direction taken along a thickness of the insulator layer;
a barrier layer deposited on the first superconducting electrode layer and within the penetration hole; and
a second superconducting electrode layer filling the penetration hole and covering the barrier layer and the insulator layer,
wherein said first and second superconducting electrode layers are made of an oxide superconductor material having $(RE)_1(AE)_2Cu_3O_y$ as a main component, where an element RE is at least one element selected from a group consisting of Y, La, Pr, Nd, Sm, Eu, Gd, Dy, Ho, Er, Tm, Yb and Lu, and an element AE is at least one element selected from a group consisting of Ba, Sr and Ca; and
said barrier layer is made of a material that includes the element RE, the element AE, Cu and oxygen, where in cations within the material forming the barrier layer, a Cu content is in a range of 35 At. % to 55 At. % and an RE content is in a range of 12 At. % to 30 At. %, and the barrier layer has a composition different from compositions of the first and second superconducting electrode layers.

2. The Josephson device as claimed in claim 1, wherein each of the first and second superconducting electrode layers and the insulator have the Perovskite structure as its basic structure, and an atomic plane made up of Cu and oxygen in each of the first and second superconducting electrode layers is perpendicular to the surface of the substrate.

3. The Josephson device as claimed in claim 1, wherein the Cu content and the RE content in the composition of the barrier layer respectively differ from those of the compositions of the first and second superconducting electrode layers by 3 At. % or more.

4. The Josephson device as claimed in claim 1, wherein the barrier layer has the element RE made of Y and the element AE made of Ba, and in the cations within the material forming the barrier layer the Cu content is in a range of 35 At. % to 55 At. % and a Y content is in a range of 12 At. % to 30 At. %.

5. The Josephson device as claimed in claim 1, wherein:
each of the first and second superconducting electrode layers and the barrier layer includes an element LRE, where the element LRE is at least one element selected from a group consisting of La, Ce, Pr, Nd, Sm and Eu; and
an LRE content of the barrier layer is larger than an LRE content of each of the first and second superconducting electrode layers.

6. The Josephson device as claimed in claim 5, wherein the Cu content, the RE content or the LRE content of the barrier layer is analyzed by an Energy Distribution X-ray spectroscopy (EDX) by irradiating an electron beam having a beam diameter of 1 nm or less on the barrier layer.

* * * * *